United States Patent [19]
Kim et al.

[11] Patent Number: 5,438,013
[45] Date of Patent: Aug. 1, 1995

[54] METHOD OF MAKING A SEMICONDUCTOR MEMORY DEVICE HAVING A CAPACITOR

[75] Inventors: Yun-gi Kim, Wonju; Jeung-gil Lee, Suwon, both of Rep. of Korea

[73] Assignee: Samsung Electronics Co., Ltd., Suwon, Rep. of Korea

[21] Appl. No.: 112,090

[22] Filed: Aug. 26, 1993

[30] Foreign Application Priority Data

Aug. 26, 1992 [KR] Rep. of Korea ............... 92-15349

[51] Int. Cl.[6] ........................................ H01L 21/8242
[52] U.S. Cl. ........................................ 437/60; 437/47; 437/52; 437/919
[58] Field of Search .............. 437/47, 48, 52, 60, 437/919; 257/307, 308

[56] References Cited

U.S. PATENT DOCUMENTS

| | | | |
|---|---|---|---|
| 5,061,650 | 10/1991 | Dennison et al. | 437/60 |
| 5,314,835 | 5/1994 | Iguchi et al. | 437/52 |
| 5,330,614 | 7/1994 | Ahm | 437/60 |
| 5,372,965 | 12/1994 | Ryou | 437/60 |

FOREIGN PATENT DOCUMENTS

| | | | |
|---|---|---|---|
| 000873 | 1/1994 | WIPO | 437/60 |

*Primary Examiner*—Tom Thomas
*Attorney, Agent, or Firm*—Charles R. Donohoe; Robert A. Westerlund, Jr.; Stephen R. Whitt

[57] ABSTRACT

A capacitor of a semiconductor memory device having a greater cell capacitance than a double-cylindrical capacitor and an improved method for manufacturing the same are disclosed. A first conductive layer is formed on a semiconductor substrate and then first and second material layers are formed on the first conductive layer. The first material and second material layers are patterned to form a composite pattern comprised of a precursory first material pattern and a second material pattern. The precursory first material pattern is anisotropically etched to form a first material pattern smaller than the second material pattern. Here, an undercut portion under the second material pattern is created. Then, the first conductive layer is anisotropically and partially etched to form a first conductive layer pattern having a groove defining a protruding stepped portion into an individual cell unit. After forming a first spacer on the sidewall of the first material pattern and a second spacer on the sidewall of the groove, the first conductive layer pattern is anisotropically etched to thereby form a double-cylindrical electrode. A double-cylindrical storage electrode can be simply manufactured so that the cell capacitance of a semiconductor memory device can be reliably enlarged.

8 Claims, 18 Drawing Sheets

METHOD OF MAKING A SEMICONDUCTOR MEMORY DEVICE HAVING A CAPACITOR

BACKGROUND OF THE INVENTION

1. Field of the Invention

The present invention relates to a semiconductor memory device having a capacitor and a method for manufacturing the same, and more particularly to a highly integrated semiconductor memory device having a capacitor which includes a double-cylindrical storage electrode for high reliability and large cell capacitance for memory cells and a method for manufacturing the same.

2 Description of Related Art

The decrease in cell capacitance caused by reduced memory cell area is a serious obstruction when increasing the packing density in dynamic random access memories (DRAMs).

Generally, in a 64 Mb DRAM having a 1.5 $\mu m^2$ memory cell area employing an ordinary two-dimensional stacked capacitor cell, sufficient cell capacitance cannot be obtained even though a higher dielectric constant material, (e.g., tantalum oxide ($Ta_2O_5$)), is used. Therefore, stacked capacitors having a three-dimensional structure have been suggested to improve cell capacitance. Such stacked capacitors include, for example, double-stacked, fin-structured, cylindrical, spread-stacked, and box-structured capacitors.

Since both the outer and inner surfaces can be utilized as an effective capacitor area, the cylindrical electrode structure is favorably suited to the three-dimensional stacked capacitor, especially for an integrated memory cell which is 64 Mb or higher. Also, an improved stacked capacitor has recently been presented, wherein pillars or another inner cylinder are formed in the interior of the main cylinder. Not only may both inner and outer surfaces of the cylinder be utilized to increase the effective capacitor area, but also the outer surface of the pillars or the inner cylinder formed in the interior of the cylinder.

For example, T. Kaga et al. have suggested a crown-shaped stacked capacitor (see "Crown-Shaped Stacked-Capacitor Cell for 1.5 V Operation 64-Mb DRAM's" by T. Kaga et al., IEEE Transactions on Electron Devices Vol. 38 No. 2, February 1991, pp 255-260), wherein an inner cylinder is formed in the interior of an outer cylinder. This is hereinafter referred to as a double-cylindrical capacitor.

FIGS. 1 to 4 are sectional views for illustrating a conventional manufacturing method of the double-cylindrical stacked capacitor of a semiconductor memory device, as described in the above T. Kaga et al. paper.

FIG. 1 illustrates a step of forming a polycrystalline silicon layer 34 for forming an outer cylinder and a spacer 36. Particularly, after forming transistors on an active region of a semiconductor substrate, an insulating layer 19 is formed on the whole surface of the resultant structure for insulating the transistors from other conductive layers (which will be formed in subsequent steps). Thereafter, a planarization layer 22 is formed on the insulting layer 19, then a contact hole is formed for connecting a storage electrode with source region 14 by partially removing planarization layer 22 and insulating layer 19 formed on source region 14. Then, a pillar electrode 30 which fills the contact hole is formed by depositing and etching-back a polycrystalline silicon layer. Then a silicon nitride layer 26 and silicon dioxide layer 32 are successively formed on the surface of the thus-obtained resultant structure. Thereafter, a well is formed by partially removing silicon dioxide layer 32 and silicon nitride layer 26 formed over pillar electrode 30. The well is formed so that it defines individual cell units and exposes the surface of pillar electrode 30. Then, a polycrystalline silicon layer 34 for forming the outer cylinder is formed on the surface of the resultant structure. And then another silicon dioxide layer is formed on polycrystalline silicon layer 34 and is anisotropically etched, thereby forming a spacer 36 on an interior sidewall of each well.

FIG. 2 illustrates a step of forming a polycrystalline silicon layer 38 and a silicon dioxide layer 40. After the step of FIG. 1, polycrystalline silicon layer 38 for forming an outer cylinder is formed on the surface of the resultant structure in FIG. 1 on which spacer 36 has been formed. Then, silicon dioxide layer 40 is formed on the surface of the resultant structure so as to cover polycrystalline silicon layer 38.

FIG. 3 illustrates a step of forming a storage electrode 100. After the steps illustrated in FIG. 2, silicon dioxide layer 40 is etched back. The etch-back is performed on the surface of the structure until a portion of polycrystalline silicon layer 38 is exposed. Then, the exposed polycrystalline silicon layer 38 is in turn anisotropically etched to thereby expose a portion of polycrystalline silicon layer 34, which is likewise partially removed by anisotropically etching, thereby forming a storage electrode 100 comprised of outer cylinder 34' and inner cylinder 38'. Here, reference numeral 40' denotes an oxide residue formed in the inner cylinder results from the etching back of silicon dioxide layer 40.

FIG. 4 illustrates a step of completing a capacitor. After removing oxide residue 40', spacer 36 and silicon dioxide layer 32, a dielectric layer 110 is formed on the whole surface of storage electrode 100. A plate electrode 120 is then formed by depositing a polycrystalline silicon material on the whole surface of the resultant, thereby completing a capacitor comprised of storage electrode 100, dielectric film 110 and plate electrode 120.

According to the above conventional method for manufacturing a capacitor of a semiconductor memory device, a double cylinder-type storage electrode having an inner cylinder inside an outer cylinder can be manufactured, thereby enlarging the cell capacitance of a semiconductor memory device. However, this method has certain drawbacks.

First, as shown in FIG. 1, after the contact hole for the formation of the pillar electrode is formed, the hole is filled a polycrystalline silicon. Precise filling of the contact hole with the polycrystalline silicon is crucial because the shape of the outer cylinder formed over the contact hole depends on the state in which the polycrystalline silicon fills the contact hole. This process is very difficult to achieve with the precision required.

Second, as shown in FIG. 1, when forming the well by anisotropically etching silicon dioxide layer 32, the well is apt to be formed so as to have a sloped sidewall, which causes voids between cells when subsequently forming the corresponding plate electrode. Thus, the electrical characteristics of the memory device are potentially deteriorated.

Third, etching-back silicon dioxide layer 40 as shown in FIG. 3 is difficult to control with precision, so uniform cell capacitance cannot be easily obtained.

Fourth, as shown in FIG. 2, since the storage electrode is the result of polycrystalline silicon layers 34 and 38 and pillar electrode portion 30, a native oxide layer forms on the opposing surfaces of the polycrystalline silicon layers. This undesireably increases the series electrical resistance. It also decreases the interlayer adherence so that fragments of the polycrystalline silicon layer may be lost when force is applied thereto, for example, when spinning the wafer.

Fifth, since the double-cylindrical electrode thus obtained has sharply edged ends, excessive leakage currents are created.

SUMMARY OF THE INVENTION

An object of the present invention is to provide a semiconductor memory device having a capacitor having a larger effective surface area than the above-described conventional double-cylindrical capacitor.

Another object of the present invention is to provide a method for manufacturing a semiconductor memory device having a capacitor as above.

According to the present invention, a double-cylindrical storage electrode having at least one additional bar portion inside the inner cylinder can be manufactured. Also, a cylindrical electrode having at least three cylinders can be manufactured. Thus, a storage electrode having a larger cell capacitance than the conventional double-cylindrical type electrode can be manufactured.

Also, according to the method for manufacturing a semiconductor memory device of the present invention, since a first conductive layer is anisotropically etched to form a double-cylindrical storage electrode without sharply edged ends, leakage current can be avoided.

Additionally, a double-cylindrical storage electrode can be formed from a single conductive layer which fills a contact hole for connecting the storage electrode to a source region of a transistor. Therefore, the double-cylindrical storage electrode can be easily manufactured without voids and native oxide formation problems which occur when the storage electrode is made from several portions. The reliability of the semiconductor memory device is therefore advantageously enhanced.

BRIEF DESCRIPTION OF THE DRAWINGS

The above object and other advantages of the present invention will become more apparent by describing in detail a preferred embodiment of the present invention with reference to the attached drawings in which.

DESCRIPTION OF THE PREFERRED EMBODIMENT

The present invention will be described in more detail by the preferred embodiments, hereinbelow, with reference to the attached drawings.

Embodiment 1

FIGS. 5 to 9 are sectional views of a semiconductor memory device, illustrating a first embodiment of the present invention.

Figure 1:
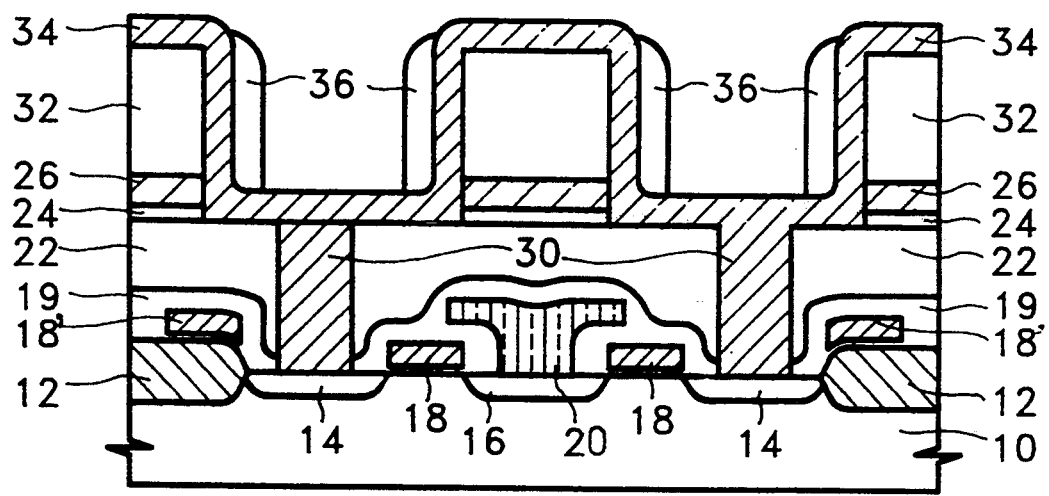
FIGS. 1 to 4 are sectional views illustrating a conventional method for manufacturing a double-cylindrical capacitor of a semiconductor memory device.
Figure 2:
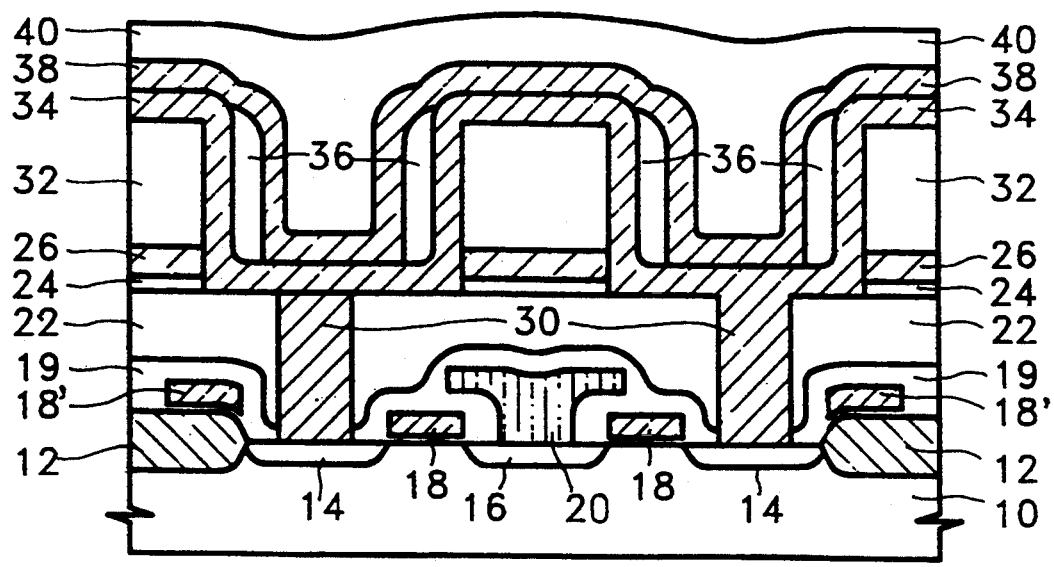
Figure 3:
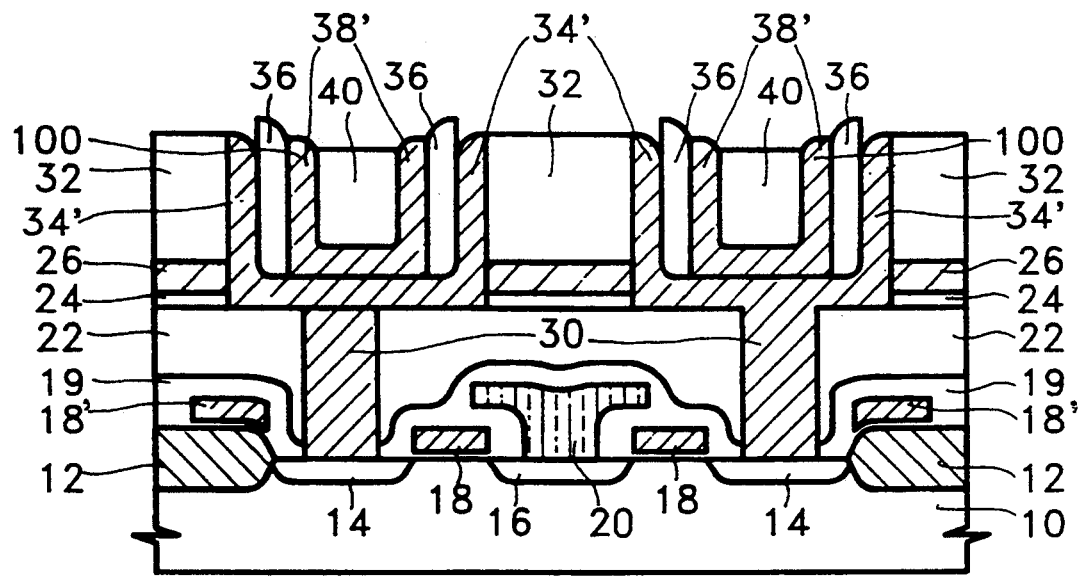
Figure 4:
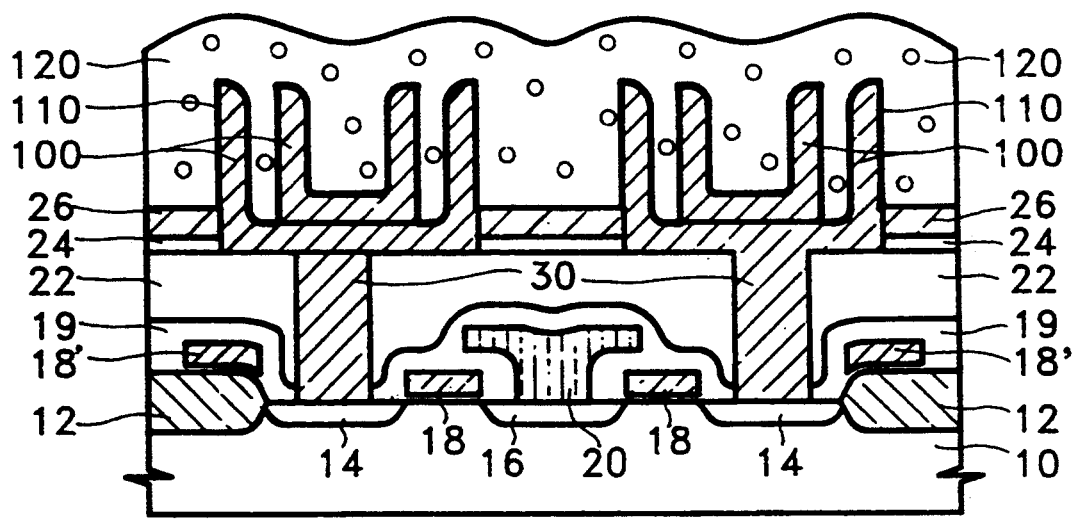
Figure 5:
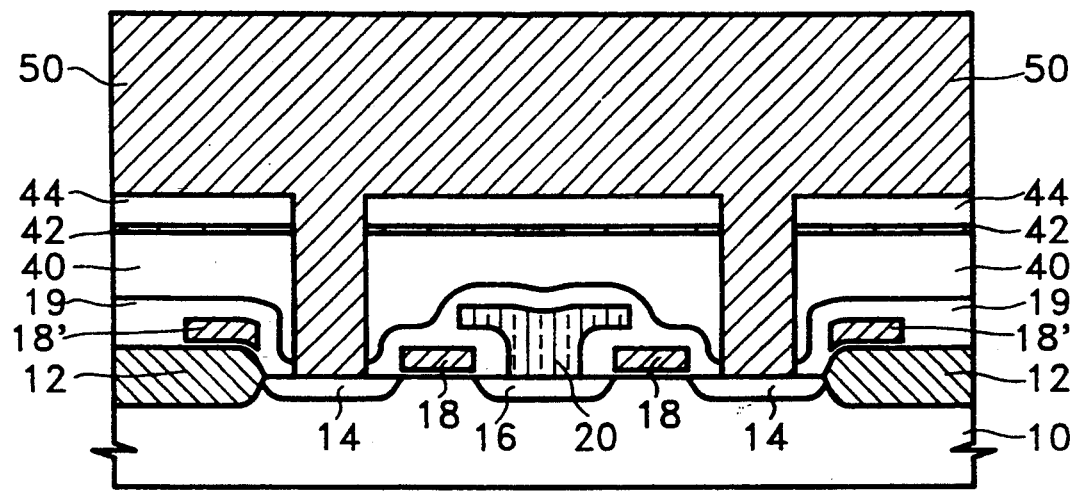
FIGS. 5 to 9 are sectional views illustrating a first embodiment of a method for manufacturing a capacitor of a semiconductor memory device according to the present invention.

FIG. 5 illustrates a step of forming a planarization layer 40, an etch-blocking layer 42, a spacer layer 44 and a first conductive layer 50.

More particularly, a field oxide layer 12 is formed on a semiconductor substrate 10 to define active and isolation regions thereon. Thereafter, in the active region, transistors are formed which commonly share a drain region 16 and a bit-line 20 in contact with drain region 16. The transistors comprise a source region 14 and gate electrode 18. On field oxide layer 12, a word line 18' connected to a gate electrode of adjacent cells is formed. Then, an insulating layer 19 is formed on the surface of the resultant structure to insulate the transistors from a conductive layer which will be formed in a later step. On insulating layer 19, in order to planarize the surface of the semiconductor substrate which is made uneven by the transistors, a material which can planarize the surface of the resultant, (e.g., plasma-enhanced tetra-ethyl-orthosilicate (PE-TEOS) or boro-phosphorous silicate glass (BPSG)), is deposited to a thickness of 4,000 Å–6,000 Å on the surface of the resultant structure and then planarized to form planarization layer 40. A nitride, (e.g., silicon nitride ($Si_3N_4$)), is deposited to a thickness of 300 Å–500 Å on planarization layer 40, to form etch-blocking layer 42. An oxide such as a high-temperature oxide (HTO) is then deposited thereon to a thickness of 500 Å–1,000 Å by low-pressure chemical vapor deposition (LPCVD) or the like, to form spacer layer 44. According to another embodiment of the present invention, the formation of planarization layer 40 may be omitted and etch-blocking layer 42 may be directly formed on insulating layer 19.

Here, spacer layer 44 is formed in order to isolate a given capacitor from the lower transistor structure. Therefore, a lower surface of the storage electrode can also be utilized to increase the effective capacitor area to increase the cell capacitance. Spacer layer 44 is removed after forming a storage electrode, to thereby expose the lower surface of the storage electrode. Spacer layer 44 can be removed using etch-blocking layer 42, since spacer layer 44 is comprised of a material having an etch rate different from that of the material constituting etch-blocking layer 42 with respect to a predetermined etching process. With respect to a predetermined etching process, it can be said that two materials have different etch rates when one of the two has an etch selectivity of greater than about four with respect to the other. In the present embodiment, as described above, a nitride may be used as the material constituting etch-blocking layer 42, and an oxide as the material constituting spacer layer 44. According to another embodiment of the present invention, the step of forming a spacer layer 44 by coating an oxide may be omitted. As a replacement, an etch-blocking layer 42 can be employed so as to utilize a lower surface of the capacitor as an effective capacitor area, by being formed as thick as the spacer layer.

Subsequently, insulating layer 19, planarization layer 40, etch-blocking layer 42 and spacer layer 44, are partially removed via a conventional photolithography process to form a contact hole which exposes portions of source regions 14, for electrical connection between a storage electrode and source region 14. Thereafter, a conductive material, (e.g., polycrystalline silicon doped with an impurity), is deposited to a thickness of about 4,000 Å–6,000 Å on the surface of the resultant structure, to form first conductive layer 50. It is preferable that first conductive layer 50 be formed so as to also fill the contact hole and to have a smooth and substantially planarized upper surface.

Here, when manufacturing a semiconductor memory device having a higher integration density or a high degree of reliability, a spacer (not shown) is preferably formed on a sidewall of each contact hole. Such a spacer is formed by depositing an insulating material, (for example, HTO), on the surface of the resultant structure having contact holes formed therein, thereby forming an insulating material layer. The insulating material layer is then anisotropically etched to form a spacer o the sidewall of each contact hole.

Also, when forming the spacer on the inner sidewall of each contact hole as above, a protective layer comprised of a material having a different etch rate from that of the material constituting spacer layer 44 with respect to a predetermined etching process (usually, the same material as that constituting the etch-blocking layer 42), is preferably interposed between the inner sidewall of the contact hole and the spacer so that the spacer may be prevented from being simultaneously removed when spacer layer 44 is removed in a subsequent step.

Figure 6:
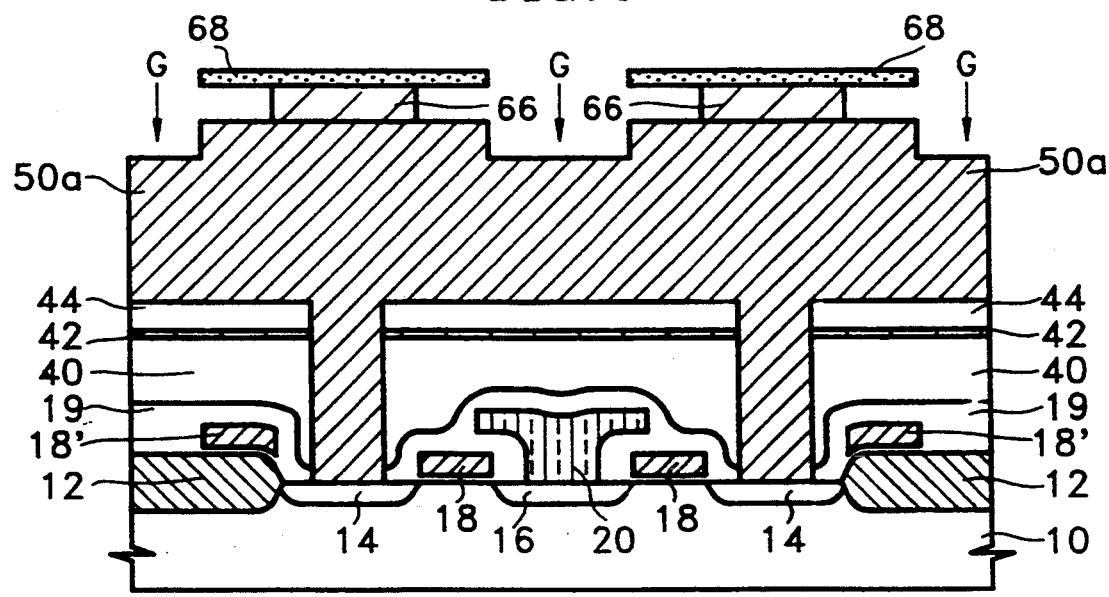

FIG. 6 illustrates a step of forming a first material pattern 66, a second material pattern 68 and a first conductive layer pattern 50a. Particularly, on the whole surface of the semiconductor substrate on which first conductive layer 50 is formed, a material having an etch rate different from that of the material constituting first conductive layer 50 with respect to a predetermined etching process, such as a nitride (for example, silicon nitride) or an oxide (for example, HTO), is deposited to a thickness of 500 Å–1,000 Å to form a first material layer (not shown). Then, on the surface of the first material layer, a second material having a different etch rate from the material constituting the first material layer with respect to a predetermined isotropic etching process, and from that of the material constituting first conductive layer 50 with respect to a predetermined anisotropic etching process, for example, an oxide (when using a nitride for the first material layer) or a nitride (when using an oxide for the first material layer), is coated to a thickness of about 500 Å–1,000 Å to thereby form a second material layer. Thereafter, the first and second material layers are anisotropically etched via a conventional photolithography process until the surface of first conductive layer 50 is exposed, thereby forming a composite pattern defined into individual cell unit and comprised of a precursory first material pattern (not shown) (which is a precursor of first material pattern 66 seen in FIG. 6) and second material pattern 68 having the same size as the precursory first material pattern and being stacked thereon.

Then, the first material layer pattern is isotopically etched in a horizontal direction via wet etching to partially remove about 1,000 Å–1,500 Å from the sidewalls of the first material layer pattern, thereby forming first material pattern 66 as seen in FIG. 6. Here, when the first material layer is comprised of a nitride, a phosphoric acid may be used as a wet etchant. When the first material layer is comprised of an oxide, a buffered oxide etchant (BOE) may be used as a wet enchant. The BOE is an oxide enchant which is made by mixing $NH_4F$ and HF in an appropriate ratio. Here, the amount of anisotropic etching to form first material pattern 66 is determined considering the width of a spacer 70a which is to be formed on a sidewall of first material pattern 66 in a subsequent step. The lateral length of the etched edge should be greater than the width (i.e., the longest lateral length or the width of a lower surface) of the spacer. Otherwise, a double-cylindrical electrode cannot be manufactured.

Next, an anisotropic etching is performed on the whole surface of the resultant structure by using second material layer 68 as an etching mask and first conductive layer 50 as an etching target so that first conductive layer 50 is etched to a predetermined depth, for example, about 1,000 Å–1,500 Å to form a first conductive layer pattern 50a having grooves G between individual adjacent cell units. The grooves define an upwardly protruding stepped portion of first conductive layer pattern 50a into an individual cell unit.

The step of forming first material pattern 66 may be instead performed after the step of forming first conductive layer pattern 50a. That is, after forming the composite pattern comprised of the precursory first material pattern and the second material pattern 68, first conductive layer 50 is anisotropically etched to form first conductive layer pattern 50a, and then the precursory first material pattern is isotopically etched to form first material pattern 66. First material pattern 66 is also smaller than the protruding stepped portion of first conductive layer pattern 50a.

Figure 7:
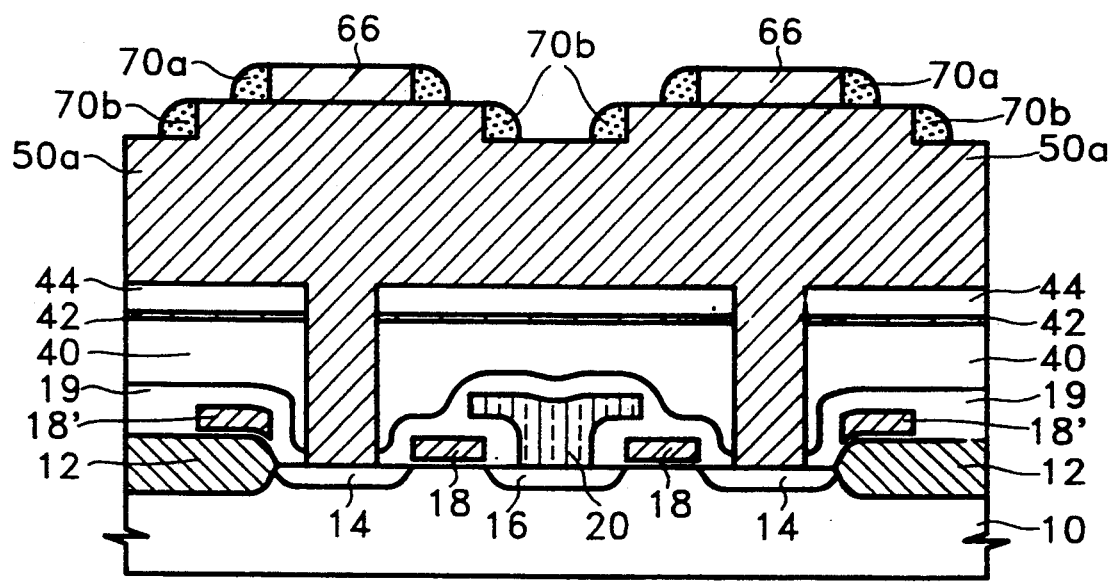

FIG. 7 illustrates a step of forming first spacers 70a on the sidewalls of first material patterns 66 and second spacers 70b on the sidewalls of the grooves G. Both first and second spacers 70a and 70b are comprised of a third material (i.e., a material other than that comprising first material pattern 66 and second material pattern 68). Particularly, after removing second material pattern 68, a third material having a different etch rate from that of the materials constituting first material pattern 66 and first conductive layer pattern 50a with respect to a predetermined anisotropic etching, (for example, an oxide (when first material pattern 66 is comprised of a nitride) or a nitride (when first material pattern 66 is comprised of an oxide)) is coated to a thickness of about 500 Å to 1,000 Å on the whole surface of the resultant structure, forming a third material layer covering first conductive layer pattern 50a having first material patterns 66 formed thereon. Then, first and second spacers 70a and 70b are formed by performing anisotropically etching the surface of the third material layer, using the third material layer as an etching object.

Here, the width of first spacer 70a should be small enough to leave an edge portion of the upwardly protruding stepped portion of first conductive layer pattern 50a exposed.

Figure 8:
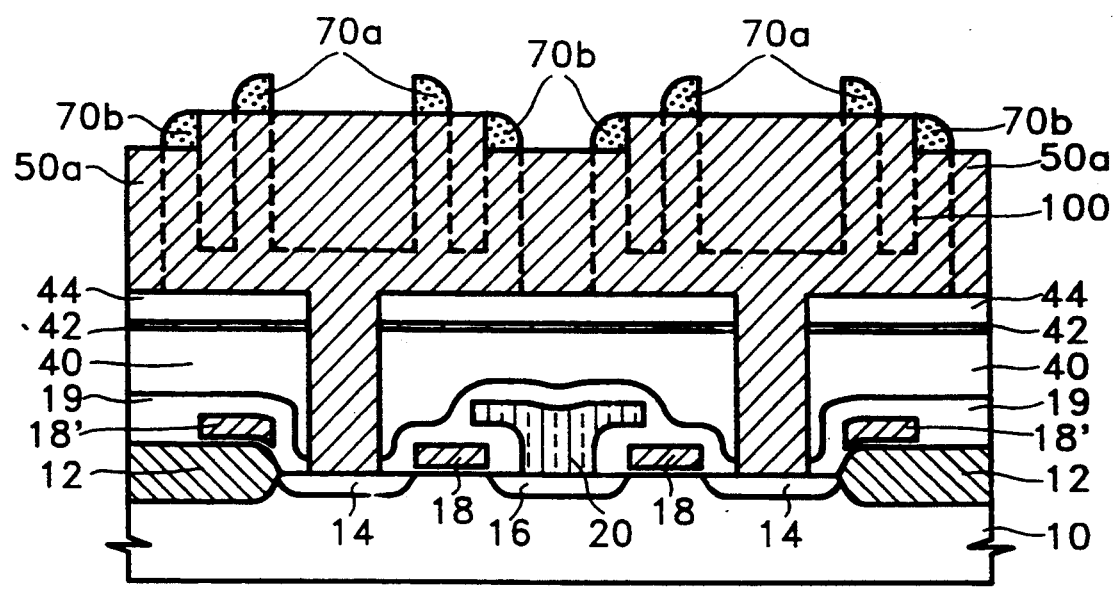

FIG. 8 illustrates a step of forming a storage electrode 100. After removing first material pattern 66 by wet etching, the exposed portions of first conductive layer pattern 50a are anisotropically etched until the surface of spacer layer 44 between adjacent second spacers 70b is exposed to complete a double-cylindrical storage electrode 100 which is defined into individual cell units. Here, the portion defined by the dotted line in FIG. 8 represents the double-cylindrical storage electrode obtained after anisotropically etching first conductive layer pattern 50a as described above.

Figure 9:
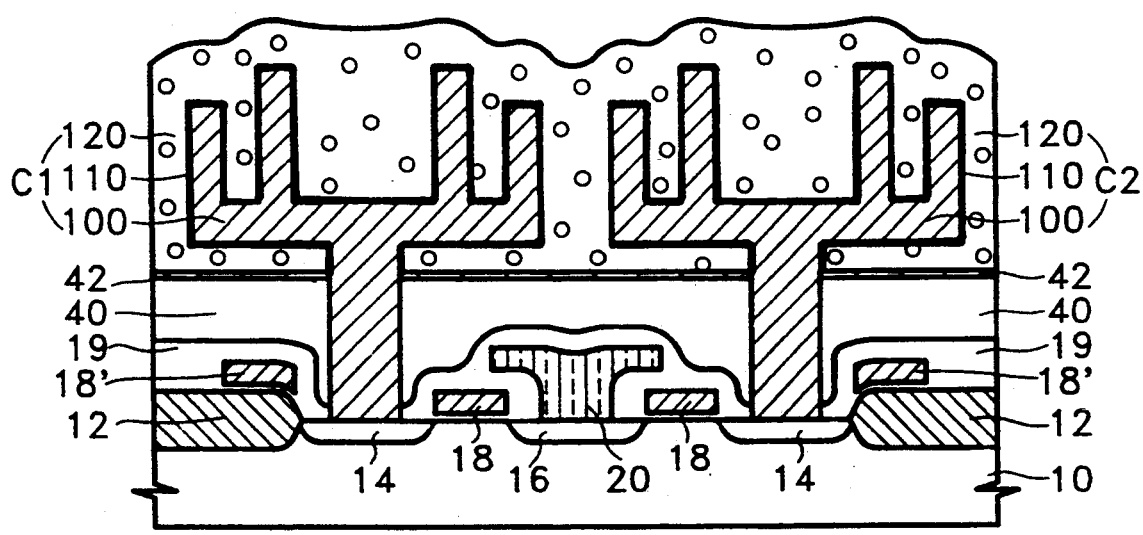

FIG. 9 illustrates a step of forming a dielectric film 110 and a plate electrode 120. After removing first and second spacers 70a and 70b, spacer layer 44 is removed to expose an underside of storage electrode 100. Then, a dielectric film, (for example, an oxide/nitride/oxide (ONO) film or $Ta_2O_5$ film), is formed to a thickness of about 60 Å on the surface of storage electrode 100. Thereafter, on the surface of the storage electrode 100 on which dielectric film 110 is formed, a conductive material, (for example, a polycrystalline silicon doped with an impurity), is deposited to a thickness of about 2,500 Å to form plate electrode 120, thereby completing a capacitor comprising storage electrode 100, dielectric film 110 and plate electrode 120.

Here, the step of removing first and second spacers 70a and 70b and spacer layer 44 can be completed by one wet etching step when first and second spacers 70a and 70b and spacer layer 44 are comprised of the same material. Otherwise, two etching steps should be performed when first and second spacers 70a and 70b are comprised of a different material from the material of spacer layer 44.

According to the first embodiment of a method for manufacturing a capacitor of a semiconductor memory device in accordance with the present invention, a capacitor having a double-cylindrical storage electrode can be easily manufactured so that the cell capacitance of a semiconductor memory device can be reliably increased.

Embodiment 2

FIGS. 10 to 13 are sectional views for illustrating a second embodiment of a method for manufacturing a capacitor of a semiconductor memory device according to the present invention.

In this embodiment, the same procedure is repeated as in Embodiment 1 except that this embodiment further includes a step of forming a fourth material layer 72 on the whole surface of the resultant obtained after the step of removing second material pattern 68 as seen in FIG. 6 of Embodiment 1.

Figure 10:
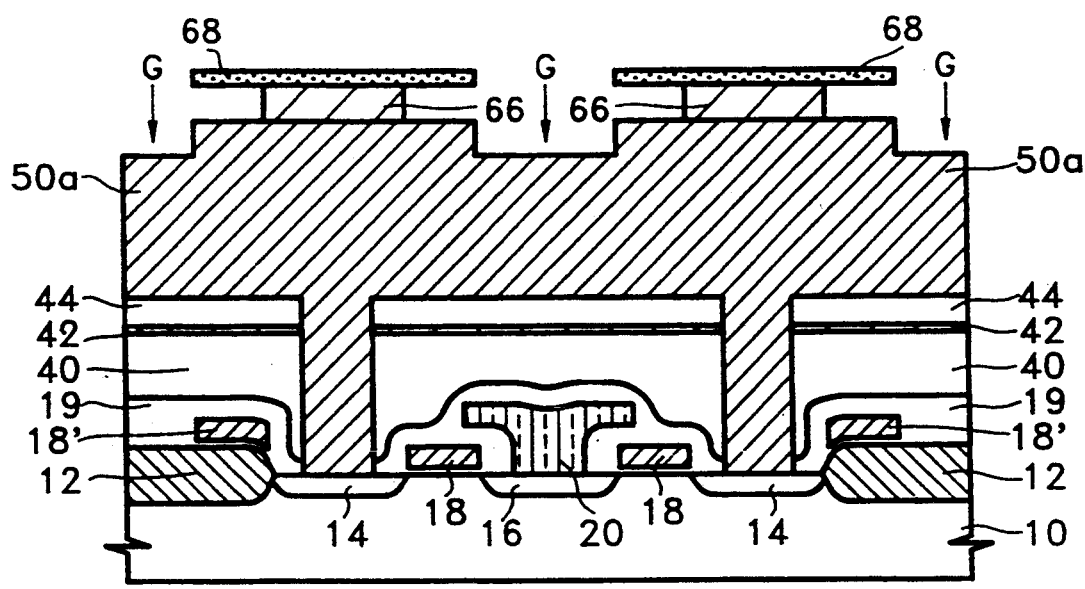
FIGS. 10 to 13 are sectional views illustrating a second embodiment of a method for manufacturing a capacitor of a semiconductor memory device according to the present invention.

FIG. 10 illustrates a step of forming a first material pattern 66, a second material pattern 68 and a first conductive layer pattern 50a. Particularly, first material pattern 66, second material pattern 68 and first conductive layer pattern 50a are formed in the same manner as in Embodiment 1.

Figure 11:
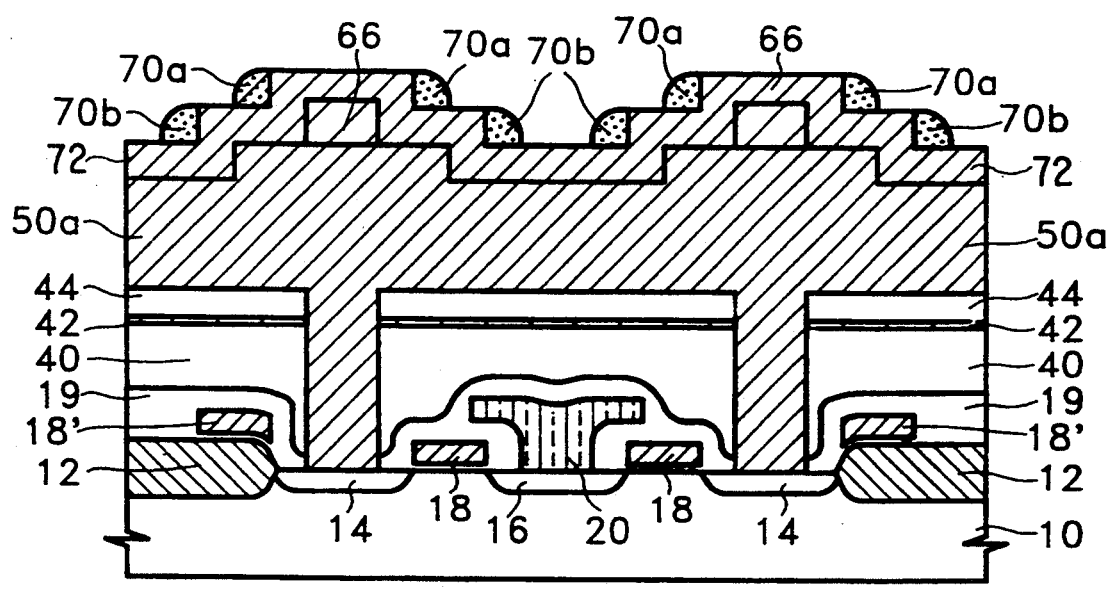

FIG. 11 illustrates a step of forming a fourth material layer 72 and first and second spacers 70a and 70b, after removing second material pattern 68. Particularly, after removing second material pattern 68 in FIG. 10, a fourth material is deposited to form a fourth material layer 72 on the surface of the resultant structure, including first conductive layer pattern 50a and first material pattern 66. Here, a fourth material, having the same etch rate as that of the material constituting first conductive layer pattern 50a, preferably polycrystalline silicon doped with an impurity, is deposited to a thickness of about 1,000 Å–1,500 Å. The resultant structure has a dual upwardly stepped portion comprised of an upper stepped portion and a lower stepped portion, as seen in FIG. 11, since the fourth material layer 72 covers first conductive layer pattern 50a having a groove (between adjacent individual cell units) and having a first material pattern 66 formed on the protruding portion thereof.

Thereafter, a third material is coated on the whole surface of the resultant structure, to form a third material layer, which is then anisotropically etched to form first spacers 70a on the sidewall of the first stepped portion (the upper stepped portion) and second sidewalls 70b on the sidewall of the second stepped portion (the lower stepped portion) of fourth material layer 72 as seen in FIG. 11. For the third material, any material having a different etch rate from the material constituting the fourth material layer 72 with respect to an anisotropic etching process is acceptable, without any consideration of the material constituting first material pattern 66. In this embodiment, an oxide or a nitride is preferably used as the third material.

Figure 12:
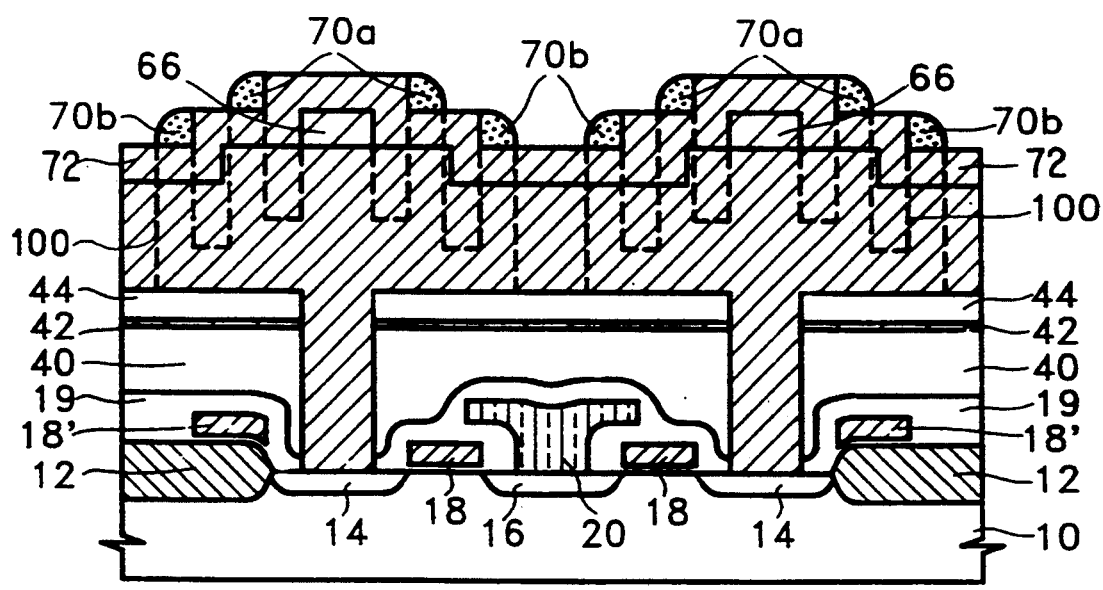

FIG. 12 illustrates a step of forming a storage electrode 100. Particularly, after the step of FIG. 11, both fourth material layer 72 and first conductive layer pattern 50a are anisotropically etched using first and second spacers 70a and 70b as an etching mask, until the surface of spacer layer 44 disposed between adjacent second spacers 70b is exposed so as to complete a double-cylindrical storage electrode 100 having a central bar within the inner cylinder. During this etching step, after fourth material layer 72 is anisotropically etched to expose first material pattern 66, the exposed first material pattern 66 then functions as an additional etching mask, to thereby form a bar within the inner cylinder of a storage electrode. Here, the portion defined by the dotted line represent the double-cylindrical storage electrode (having a central bar) obtained after anisotropically etching fourth material layer 72 and first conductive layer pattern 50a.

When the material constituting the fourth material layer 72 has a different etch rate from that of the material constituting first conductive layer pattern 50a with respect to a predetermined anisotropic etching, two separate anisotropic etching steps must be performed to etch fourth material layer 72 and first conductive layer pattern 50a which is not desirable.

When fourth material layer 72 is made of the same material constituting first conductive layer pattern 50a, the remaining portions of fourth material layer 72 under first and second spacers 70a and 70b become a part of the storage electrode.

Figure 13:
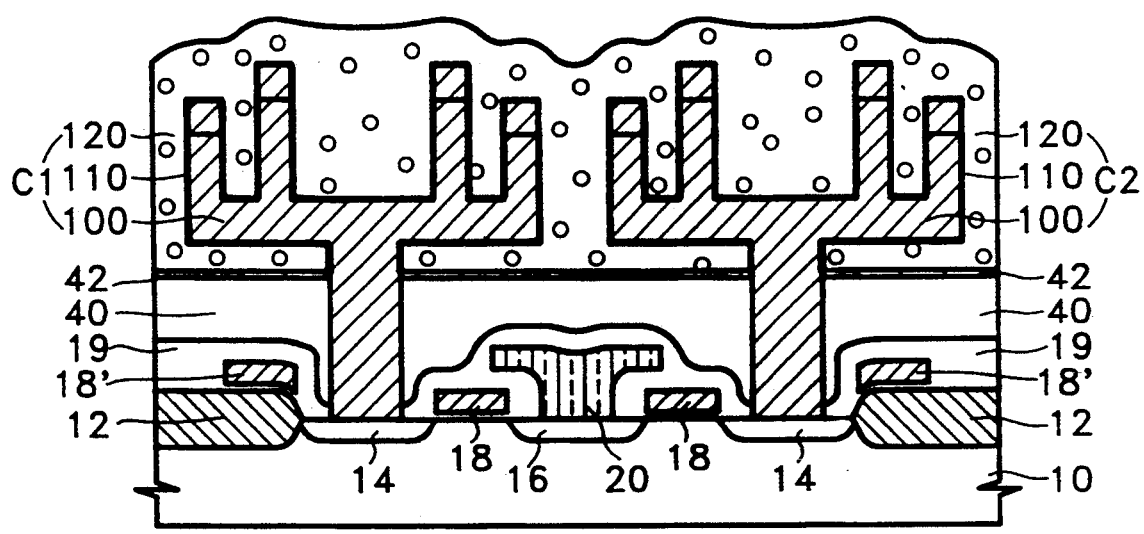

FIG. 13 illustrates a step of forming a dielectric film 110 and a plate electrode 120. After removing first and second spacers 70a and 70b, first material pattern 66, and spacer layer 44 to thereby expose storage electrode 100, dielectric film 110 and plate electrode 120 are subsequently formed in the same manner as in Embodiment 1, thereby completing a capacitor comprising storage electrode 100, dielectric film 110 and plate electrode 120.

According to the present embodiment, a double-cylindrical storage electrode having a central bar in the inner cylinder can be obtained. However, when several discrete portions of first material pattern are formed on the protruding stepped portion of the first conductive layer pattern 50a, (for example, if the first material pattern 66 is divided into four pieces), it is clear that a corresponding number of bars will be formed inside the inner cylinder. Also, the height of the cylinder can be increased by as much as the thickness of fourth material layer 72. Therefore, the capacitor obtained by the second embodiment can obtain even larger cell capacitance than that of Embodiment 1 and also the conventional double-cylindrical capacitor.

Embodiment 3

Figure 14:
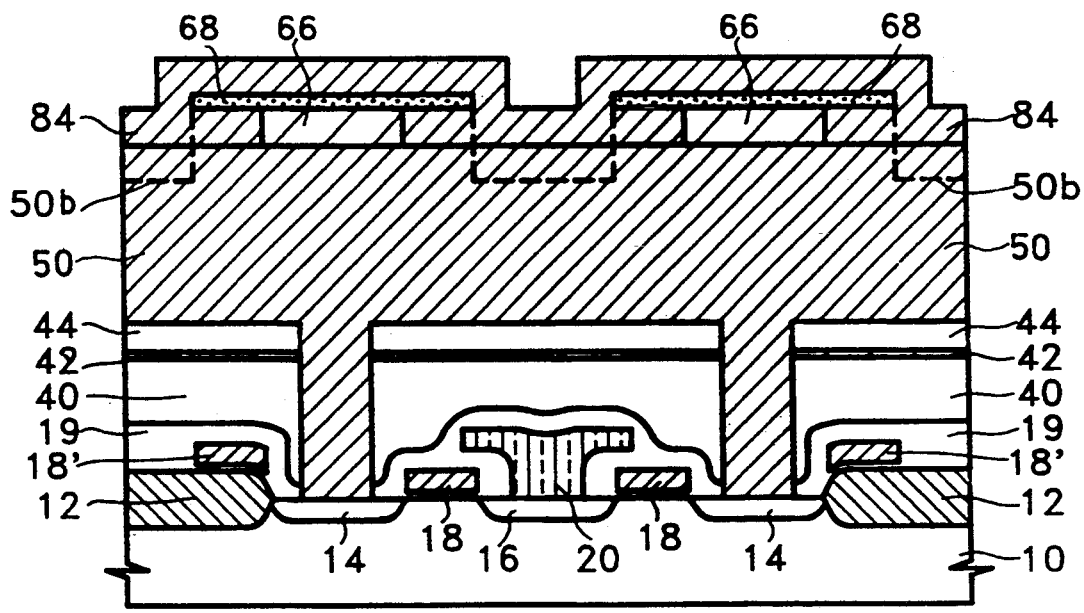
FIGS. 14 to 16 are sectional views illustrating a third embodiment for manufacturing a capacitor of a semiconductor memory device according to the present invention.
Figure 15:
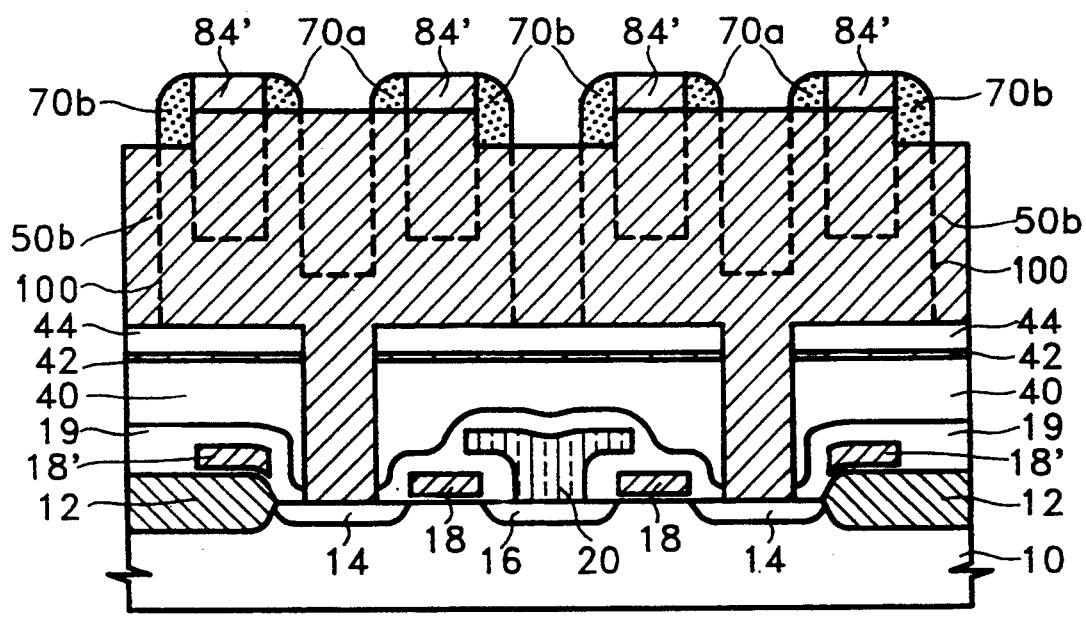
Figure 16:
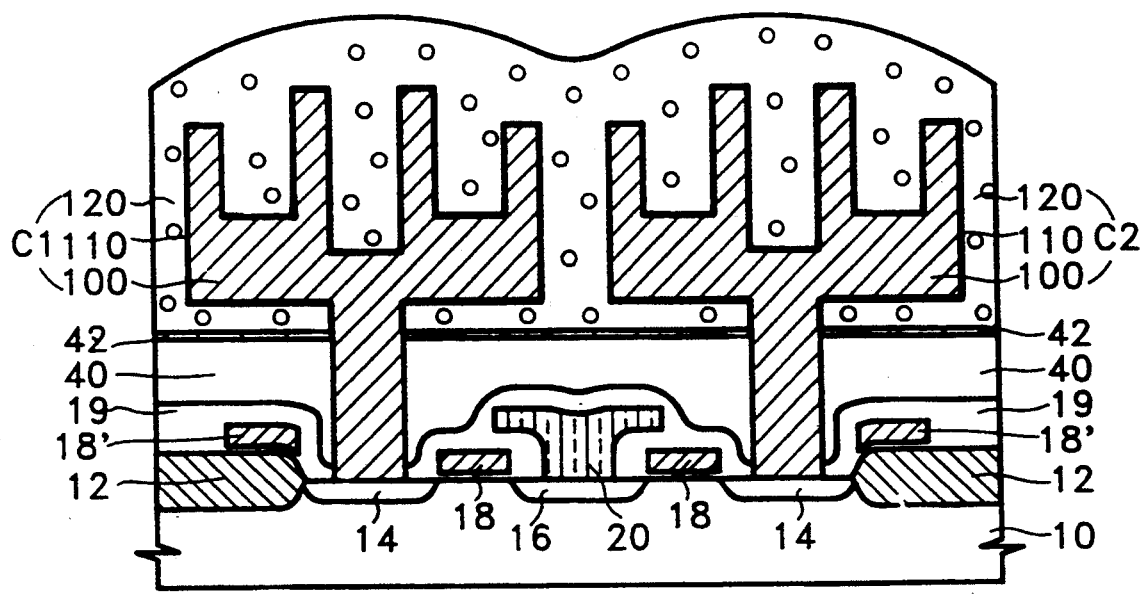

FIGS. 14 to 16 are sectional views illustrating a third embodiment of a method for manufacturing a capacitor of a semiconductor memory device according to the present invention.

FIG. 14 illustrates a step of forming a first material pattern 66, a second material pattern 68 and a fifth material layer 84. In the same manner as in Embodiment 1, after forming a first conductive layer 50 (in FIG. 5), first material pattern 66 and second material pattern 68 are formed. Thereafter, on the surface of the resultant structure, a fifth material, whose etch rate is different from that of the material constituting second material pattern 68 with respect to a predetermined anisotropic etching process, and from that of first and second material pattern with respect to a predetermined isotropic etching process, (for example, the same material as the material constituting first conductive layer 50 (polycrystalline silicon doped with an impurity)), is deposited to form a fifth material layer 84. Next, fifth material layer 84 is anisotropically etched using second material pattern 68 as an etching mask to thereby leave a fifth material layer pattern 84' filling the undercut portions under second material pattern 68 and to either side of first material pattern 66 as seen in FIG. 15. Then, the exposed surface portion of first conductive layer 50 can be etched to a predetermined depth by the anisotropic etching to thereby form a second conductive layer pattern 50b (having a groove like first conductive layer pattern 50a of FIG. 10) marked by the dotted line in FIG. 14.

FIG. 15 illustrates a step of forming first and second spacers 70a and 70b on the sidewalls of fifth material layer patterns 84' and thereafter forming a double-cylindrical storage electrode 100. After removing first and second material patterns 66 and 68, a material whose etch rate is different from that of the material constituting first conductive layer 50 with respect to a predetermined anisotropic etching process (for example, an oxide such as HTO or a nitride such as silicon nitride) is deposited to a thickness of about 1,000 Å on the surface of the resultant to form a sixth material layer, which is anisotropically etched to form first spacer 70a on an inside sidewall of fifth material pattern 84' and second spacers 70b on an outside sidewall of fifth material pattern 84'. Here, second spacer 70b extends downwardly onto the sidewall of the groove of second conductive layer pattern 50b. Thereafter, an anisotropic etching is performed on the surface of the resultant structure by using first and second spacers 70a and 70b as an etching mask and by using fifth material pattern 84' and second conductive layer pattern 50b as an etching object, until spacer layer 44 is exposed between adjacent cell units. Thus double-cylindrical storage electrodes 100 defined into individual cell units (shown by the dotted line) are completed.

FIG. 16 illustrates a step of forming a dielectric film 110 and a plate electrode 120. After removing first and second spacers 70a and 70b, and spacer layer 44 to expose an underside of storage electrode 100, then dielectric film 110 and plate electrode 120 are subsequently formed in the same manner as in Embodiment 1, thereby completing a capacitor comprising storage electrode 100, dielectric film 110 and plate electrode 120.

According to the present embodiment, since fifth material pattern 84' and second conductive pattern 50b are simultaneously etched, a double-cylindrical storage electrode can be obtained even more simply than by the first and second embodiments.

Embodiment 4

Figure 17:
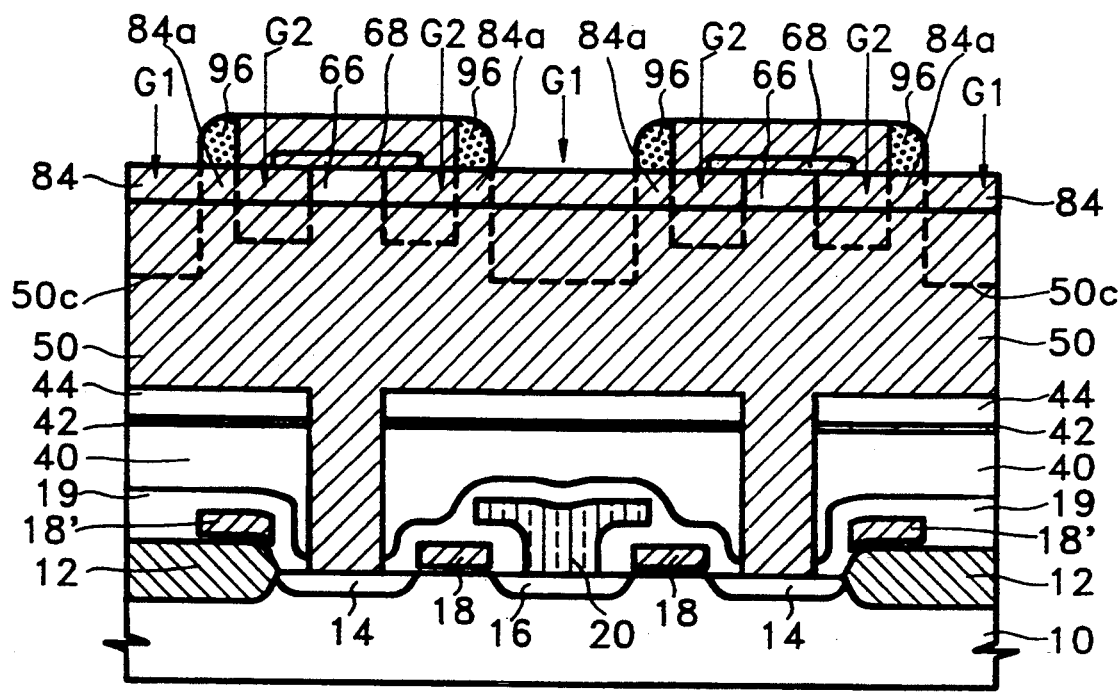
FIGS. 17 to 19 are sectional views illustrating a fourth embodiment for manufacturing a capacitor of a semiconductor memory device according to the present invention.
Figure 18:
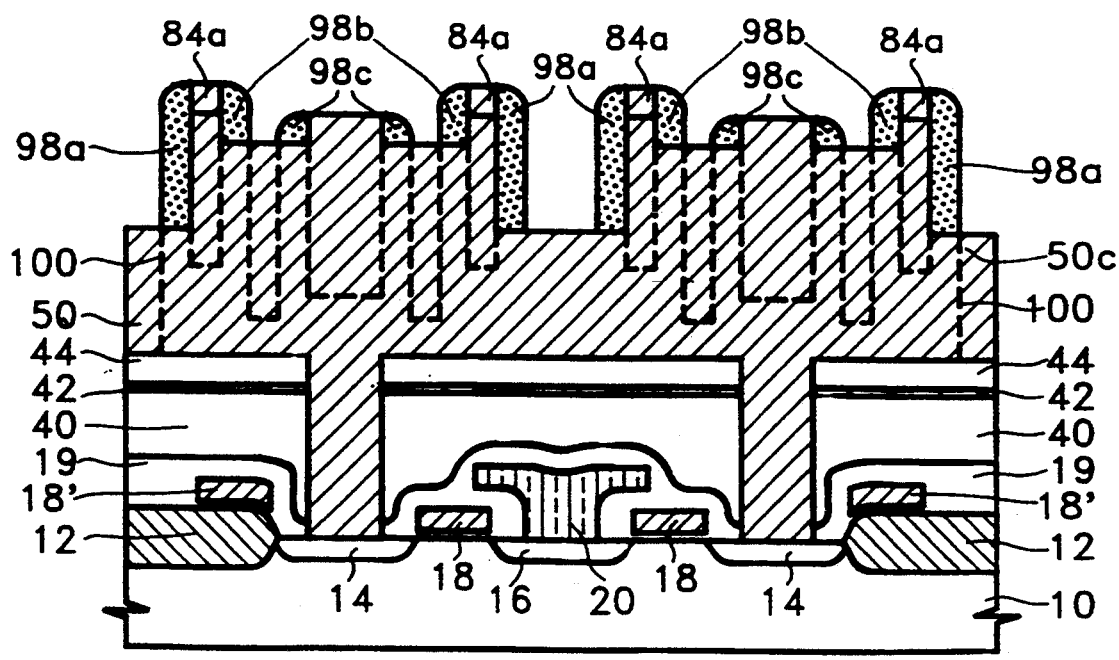
Figure 19:
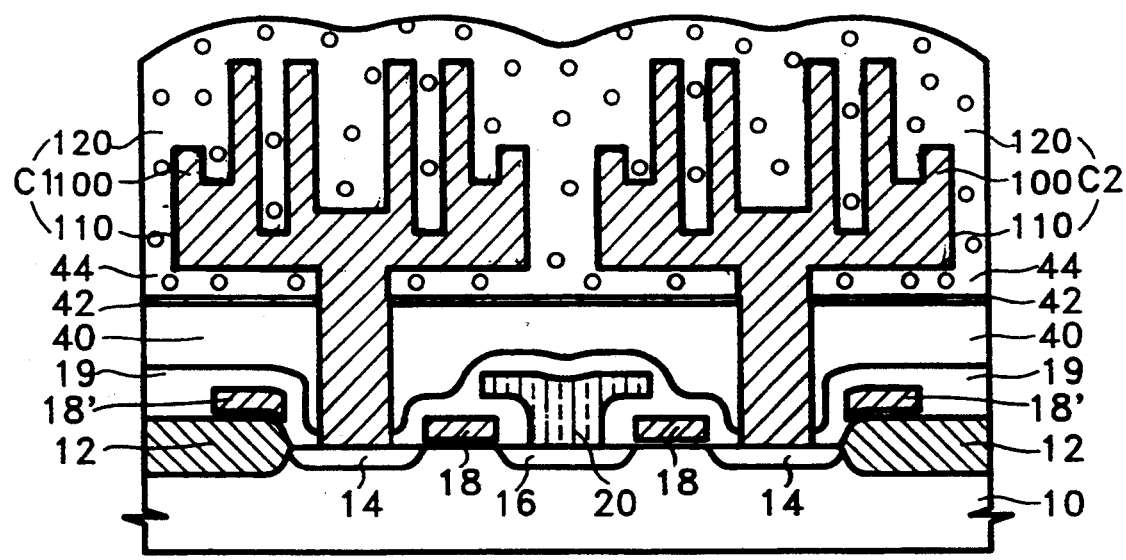

FIGS. 17 to 19 are sectional views illustrating a fourth embodiment of a method for manufacturing a capacitor of a semiconductor memory device according to the present invention.

FIG. 17 illustrates a step of forming third spacer 96 on the sidewall of the groove of fifth material layer 84 and forming a third conductive layer pattern 50c. After forming a fifth material layer 84 having a groove as seen in FIG. 14 in the same manner as in Embodiment 3, a seventh material whose etch rate is different from that of the material constituting fifth material layer 84 with respect to a predetermined anisotropic etching process, for example, a nitride or an oxide (in a case when fifth material layer 84 is made of polycrystalline silicon), is deposited to a thickness of about 1,000 Å on the surface of the resultant structure. This seventh material layer is then anisotropically etched to form third spacers 96 on the sidewalls of the groove of fifth material layer 84. A material having the same etch rate as that of fifth material layer 84 with respect to a predetermined anisotropic etching process, for example, polycrystalline silicon, should be used for second material pattern 68. Then, anisotropic etching is performed on the surface of the resultant structure by using third spacer 96 and first material pattern 66 as etch masks, to thereby etch first conductive layer 50 to a predetermined depth, for instance, about 1,500 Å. Fifth material layer 84 and second material pattern 68 are removed at an initial stage of this anisotropic etching step. As a result, a third conductive layer pattern 50c denoted by the dotted line in FIG. 17 is formed. Since first material pattern 66 functions as an etching mask during the anisotropic etching after being exposed and since the undercut portions underneath second material pattern 68 are filled by fifth material layer 84, the third conductive layer pattern 50c has a first groove G1 (between third spacers 96 of adjacent individual cell units, where the groove of fifth material layer 84 was located) defining an upwardly protruding stepped portion into individual cell units and a second groove G2 (adjacent first material pattern 66 and between the first material pattern 66 and third spacer 96) which has a shallower depth by an amount equal to the thickness of the composite pattern (the thickness of the first material pattern 66 plus that of the second material pattern 68) than the first groove G1. Since FIG. 17 is a sectional view, it may seem that two second grooves G2 are formed between the third spacer 96 and first material pattern in each cell unit. However, from a top view (not shown), it could be seen that second groove G2 surrounds first material pattern 66 and only one continuous second groove G2 is formed in each unit cell unit. After the anisotropic etching, a portion of fifth material layer 84 formed beneath spacer 96 remains. Reference numeral 84a denotes the fifth material layer pattern which is formed from fifth material 84 after the anisotropic etching.

FIG. 18 illustrates a step of forming spacers 98a, 98b and 98c on the sidewalls of first and second grooves G1 and G2 and forming storage electrode 100. After the step of FIG. 17 and after first material pattern 66 is removed, third spacers 96 are removed by wet etching. Then, on the surface of the resultant structure, a material whose etch rate is different from that of the material constituting third conductive layer pattern 50c with respect to a predetermined anisotropic etching, (for example, an oxide or a nitride), is coated to a thickness of about 500 Å-1,000 Å to form a sixth material layer. Thereafter, this sixth material layer is anisotropically etched to form first cylinder spacer 98a (for forming the outermost cylinder of a storage electrode) on the sidewall of the first groove G1 of third conductive layer pattern 50c, second cylinder spacer 98b (for forming a middle cylinder between the outer cylinder and inner cylinder) on a radially outer sidewall of groove G2 of third conductive layer pattern 50c, and third cylinder spacer 98c (for forming the inner cylinder of a storage electrode) on a radially inner sidewall of groove G2 of third conductive layer pattern 50c. Thereafter, third conductive layer pattern 50c is anisotropically etched until the surface of spacer layer 44 is exposed between adjacent cell units, using the first, second, and third cylinder spacers 98a, 98b, and 98c as etching masks, thereby forming a triple-cylindrical storage electrode 100.

FIG. 19 illustrates a step of forming a dielectric film 110 and a plate electrode 120. After removing first, second and third cylinder spacers 98a, 98b and 98c, dielectric film 110 and plate electrode 120 are subsequently formed in the same manner as in Embodiment 1, thereby completing a capacitor comprising storage electrode 100, dielectric film 110 and plate electrode 120.

According to Embodiment 4, a capacitor having a triple-cylindrical storage electrode can be manufactured by a simple process, while having a larger cell area than a double-cylindrical storage electrode so that the capacitor thus obtained can be adapted to a highly integrated memory device.

The present embodiment shows that a cylindrical capacitor having three cylinders is formed by forming one groove G2. However, it is clear that when two or more concentric grooves like G2 are formed on third conductive layer pattern 50c, several inner cylinders can be formed within the outer cylinder. Thus, a cylindrical storage electrode having three or more cylinders can be formed.

Embodiment 5

FIGS. 20 to 23 are sectional views illustrating a fifth embodiment of a method for manufacturing a capacitor of a semiconductor memory device according to the present invention. The method of the present embodiment is performed in the same manner as in Embodiment 1, except that the method of the present embodiment also includes steps of forming a thin oxide layer 51 on the exposed surface portions of first conductive layer pattern 50a after the step of forming first conductive layer pattern 50a, and then removing it.

Figure 20:
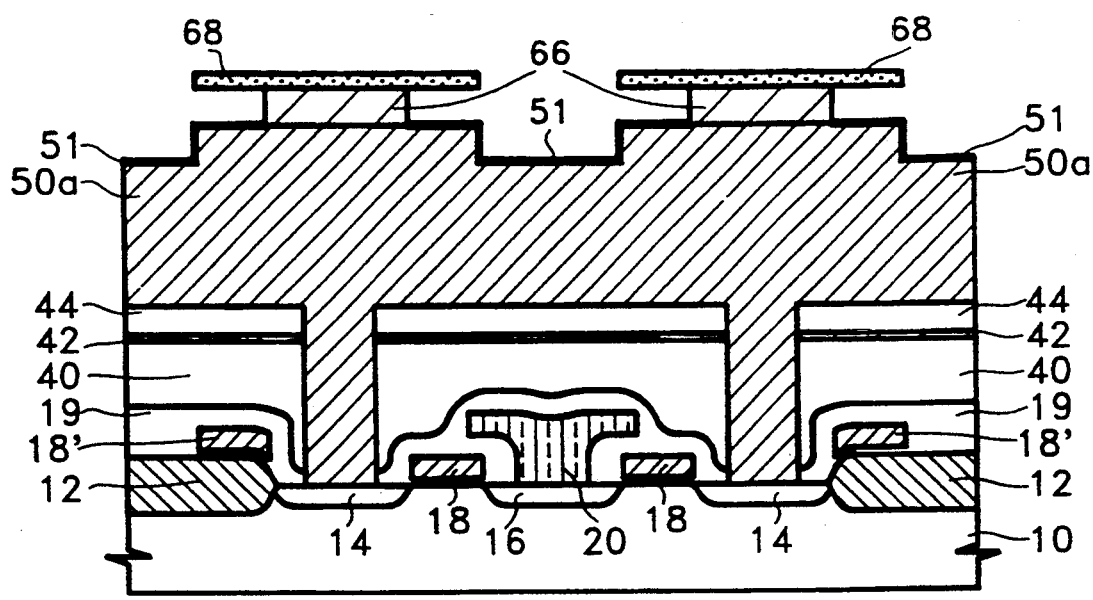
FIGS. 20 to 23 are sectional views illustrating a fifth embodiment for manufacturing a capacitor of a semiconductor memory device according to the present invention.

FIG. 20 illustrate a step of forming an oxide layer 51 on the exposed surface portion of first conductive layer pattern 50a. After the step of forming first conductive layer pattern 50a in FIG. 6 of Embodiment 1, oxide layer 51 is formed to a thickness of about 500 Å by thermally oxidizing the exposed surface of first conductive layer pattern 50a at a temperature of about 800° C.

In Embodiment 1, when first material pattern 68 is comprised of silicon nitride, the precursory first material pattern is isotopically etched using a phosphorous acid to obtain first material pattern 68. When this happens, the polycrystalline silicon in first conductive layer pattern 50a is chemically attacked in the grain boundary portion, and thus the surface of first conductive layer pattern 50a is damaged. Thereafter, when an oxide is deposited for forming the spacers, the oxide may also enter or fill the grain boundary portion of first conductive layer pattern 50a. The oxide in the grain boundary portion then remains after the step of forming the spacers for forming double cylinders. If the anisotropic etching is performed using the spacers, a polysilicon residue can form in and adjacent to the grain boundary portions, and therefore a storage electrode having a good profile cannot be ensured.

The additional steps of forming oxide layer 51 and removing the same can prevent the oxide from remaining in the grain boundary portion which has been formed by the chemical attack of the phosphoric acid used in the isotropic etching for forming first material pattern 66.

Figure 21:
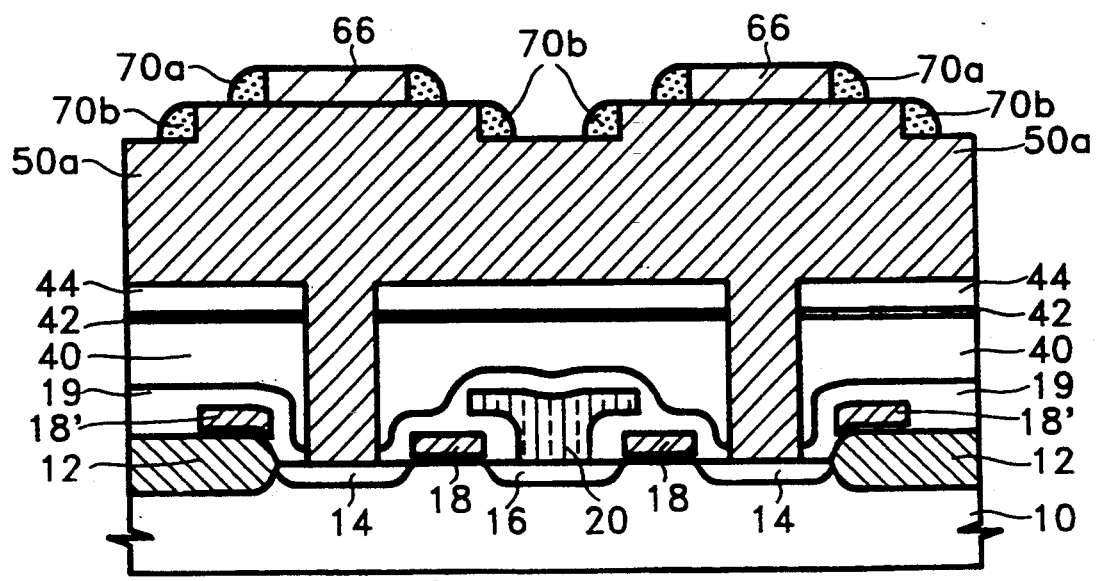

FIG. 21 illustrates a step of removing oxide layer 51 and forming first and second spacers 70a and 70b. After removing oxide layer 51 and second material pattern 68 in FIG. 20 by using a BOE, a third material, such as an oxide, is coated on the surface of the resultant structure, thereby forming a third material layer which is subsequently anisotropically etched to form first spacers 70a on the sidewall of first material patterns 66 and second spacers 70b on the sidewall of the grooves of first conductive layer pattern 50a, in the same manner as in Embodiment 1.

Figure 22:
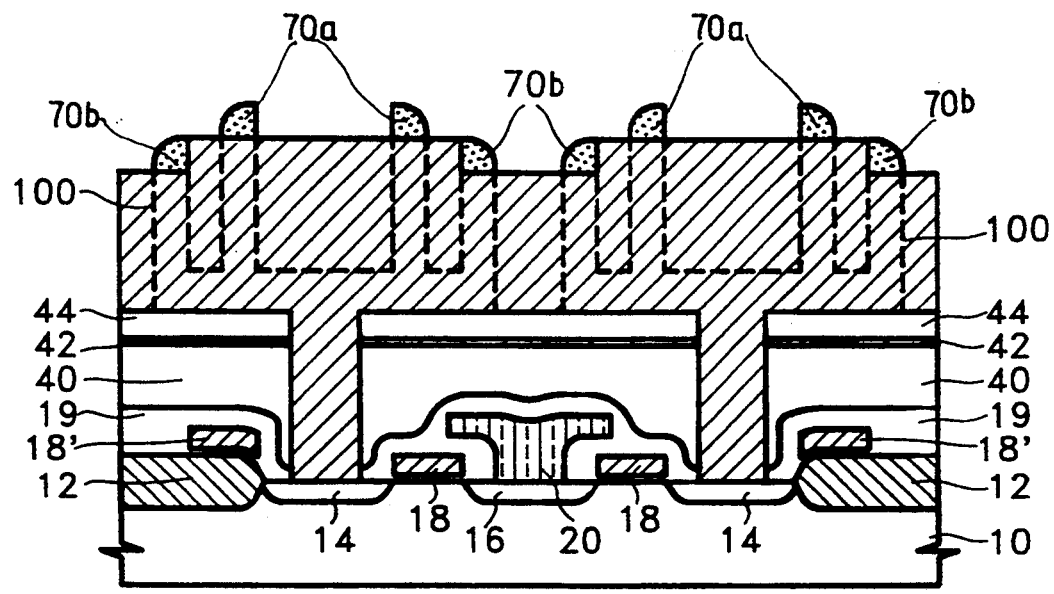
Figure 23:
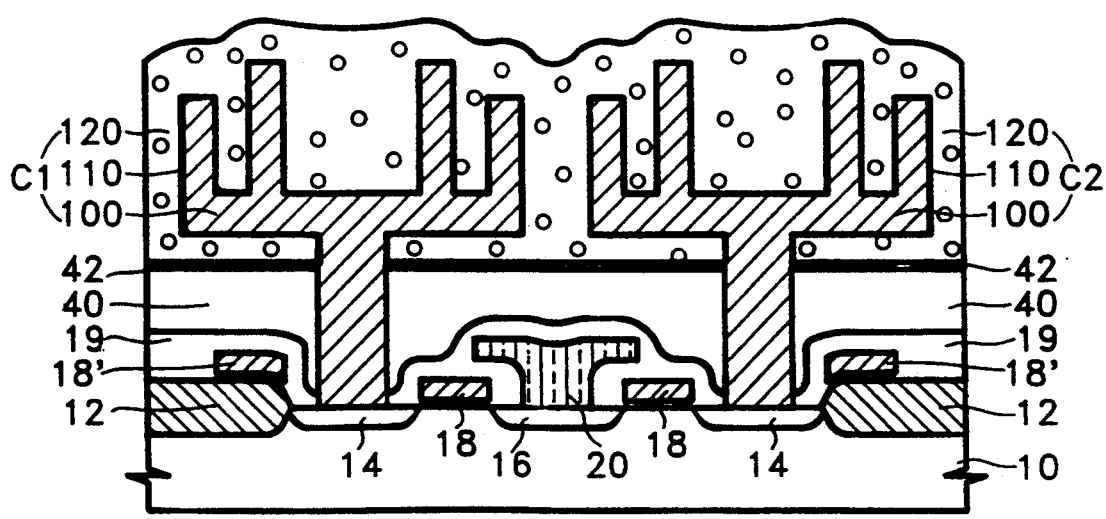

FIGS. 22 and 23 illustrate the steps of forming a storage electrode 100, a dielectric film 110 and a plate electrode 120. These steps are performed in the same manner as described in Embodiment 1 to thereby complete a capacitor having a storage electrode 100, dielectric film 110 and plate electrode 120.

According to this embodiment, the surface of first conductive layer pattern 50a, which may be chemically damaged by the isotropic etching for forming first material pattern, is protected so that a storage electrode having a good profile can be manufactured.

Embodiment 6

FIGS. 24 to 30 are sectional views illustrating a sixth embodiment of a method for manufacturing a capacitor of a semiconductor memory device according to the present invention.

Figure 24:
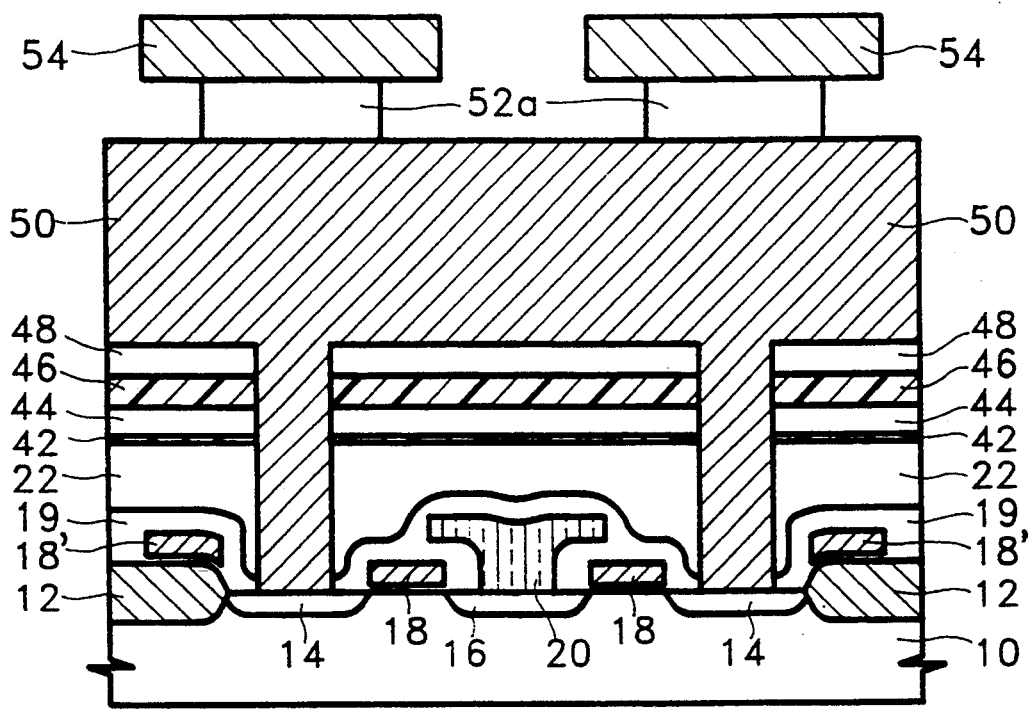
FIGS. 24 to 30 are sectional views illustrating a sixth embodiment for manufacturing a capacitor of a semiconductor memory device according to the present invention.

FIG. 24 illustrates a step of forming a first conductive layer 50, a first material pattern 52a and a photoresist pattern 54. Before forming first conductive layer 50, an oxide and nitride are alternately deposited each to a thickness of about 500 Å to form first, second and third spacer layers 44, 46 and 48.

Next, an insulating material whose etch rate is different from that of the material constituting first conductive layer 50 with respect to a predetermined anisotropic etching (for example, an oxide such as HTO) is deposited on first conductive layer 50 to a thickness of about 1,000 Å, to form a first material layer (not shown). Then, a photoresist is formed on the surface of the first material layer, and patterned via a photolithography process, to thereby form a photoresist pattern 54 defining individual cell units. Thereafter, the first material layer is anisotropically etched by using photoresist pattern 54 as an etching mask, so as to form a precursory first material pattern. Next, the precursory first material pattern is isotropically etched in a lateral direction to remove edge portions of the precursory first material pattern (by a width of about 1,000 Å–1,500 Å) to thereby form first material pattern 52a which is narrower in width than photoresist pattern 54.

Figure 25:
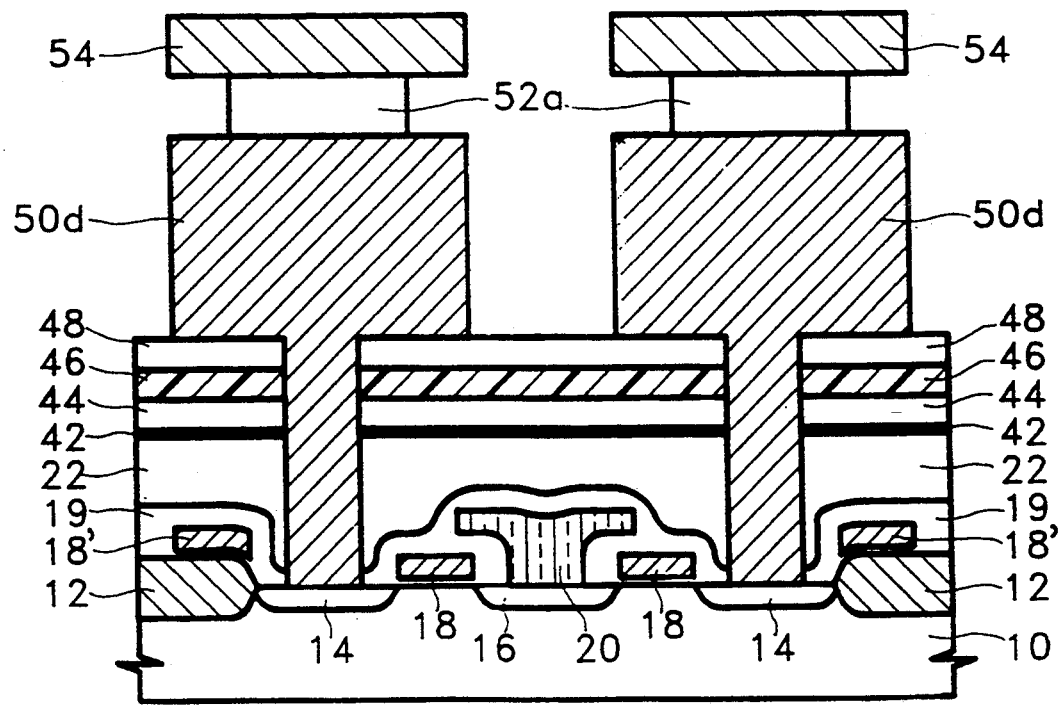

FIG. 25 illustrates a step of forming a first conductive pattern 50d. After the step of FIG. 24, first conductive layer 50 is anisotropically etched using photoresist pattern 54 as an etching mask until a portion of third spacer layer 48 is exposed, thereby forming first conductive patterns 50d defined into individual cell units.

Figure 26:
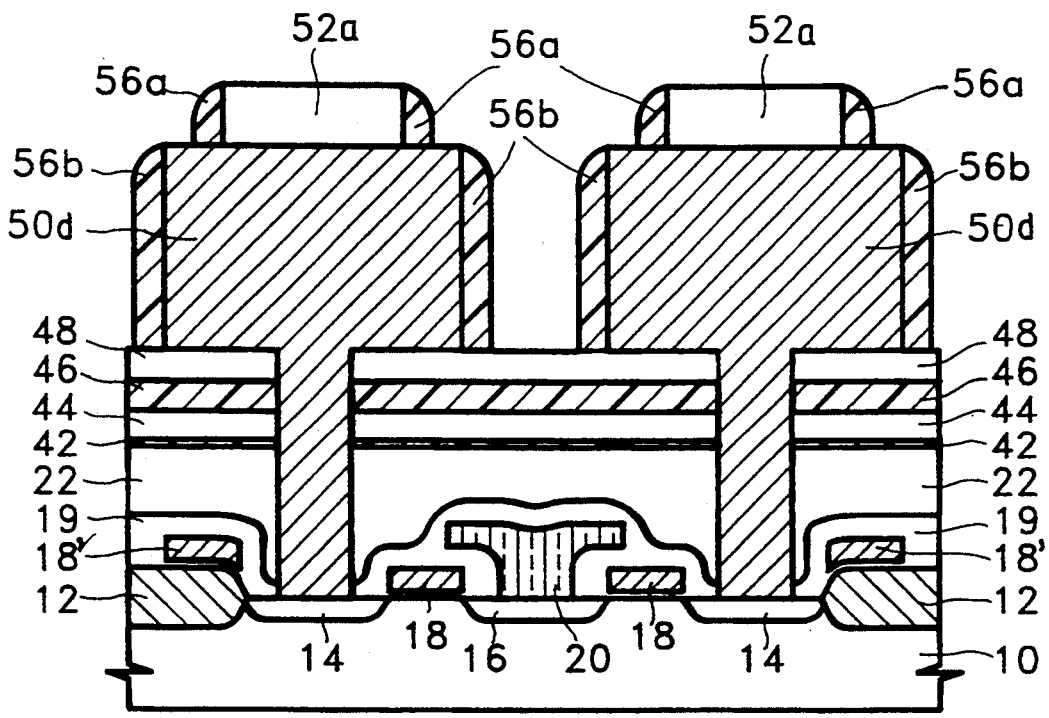

FIG. 26 illustrates a step of forming a first and second spacer 56a and 56b. After removing photoresist pattern 54, a third material is deposited on the surface of the resultant structure to a thickness of about 500 Å–1,000 Å to thereby form a third material layer which is subsequently anisotropically etched to form first spacers 56a on the sidewall of first material patterns 52a and second spacer 56b on the sidewall of first conductive patterns 50d.

Figure 27:
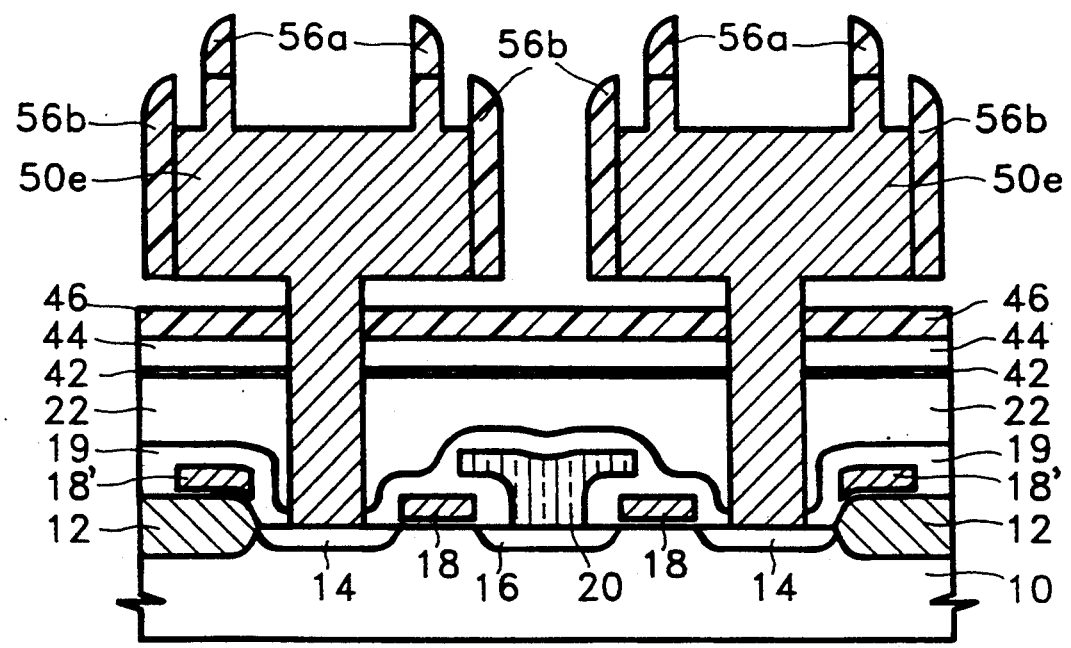

FIG. 27 illustrates a step of forming a second conductive pattern 50e having an upwardly protruding stepped portion. After the step of FIG. 26, each first material pattern 52a is removed by using an oxide enchant, (i.e., a BOE.) Simultaneously, third spacer layer 48 comprised of an oxide is also removed. Next, first conductive pattern 50d is anisotropically etched to a predetermined depth of, i.e., 500 Å, using first and second spacers 56a and 56b as etching masks, thereby forming second conductive patterns 50e having an upwardly protruding stepped portion on an upper surface thereof.

Figure 28:
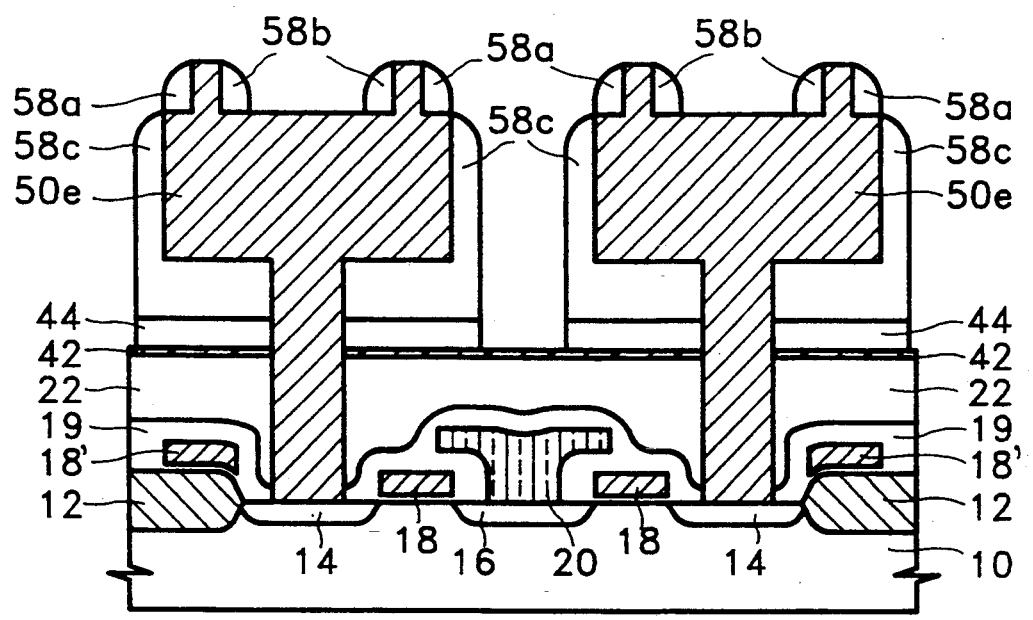

FIG. 28 illustrates a step of forming first and second cylinder spacers 58a and 58b and a third spacer 58c. After removing first and second spacers 56a and 56b and simultaneously removing second spacer layer 46, a seventh material layer is deposited to a thickness of about 500 Å–1,000 Å on the surface of the resultant structure which is anisotropically etched to form first cylinder spacers 58a (for forming the outer cylinder wall of a storage electrode) on the outside sidewall of the upwardly protruding stepped portion of second conductive pattern 50e, second cylinder spacers 58b (for forming the inner wall of a storage electrode) on the inside sidewall of the upwardly protruding stepped portion of second conductive pattern 50e, and third spacers 58c on the sidewall of each second conductive patterns 50e.

Figure 29:
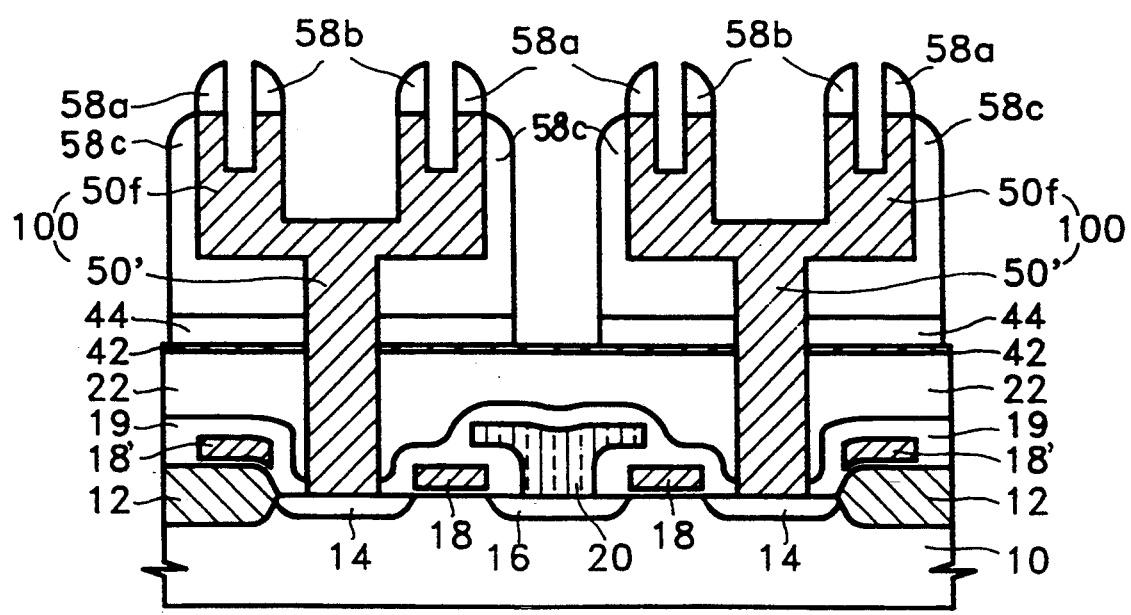

FIG. 29 illustrates a step of forming a double-cylindrical storage electrode of a capacitor of a semiconductor memory device. After the step of FIG. 28, each second conductive pattern 50e is anisotropically etched to a depth of about 2,000 Å–5,000 Å, using first and second cylinder spacers 58a and 58b as etching masks, thereby the forming a double-cylindrical storage electrode 100, which comprises a column electrode portion 50' and a double-cylindrical main electrode portion 50f.

Figure 30:
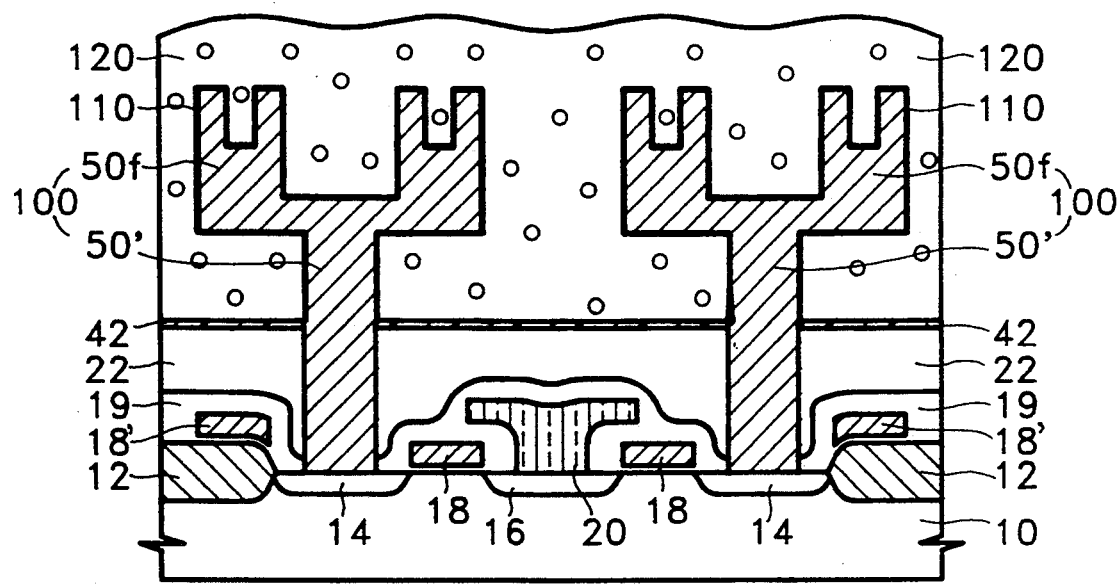

FIG. 30 illustrates a step of forming a dielectric film 110 and a plate electrode 120. After removing first and second cylinder spacers 58a and 58b and third spacer 58c and simultaneously removing first spacer layer 44, dielectric film 110 and plate electrode 120 are formed in the same manner as described in Embodiment 1 to complete a capacitor comprising storage electrode 100, dielectric film 110 and plate electrode 120.

Embodiment 7

FIGS. 31 to 35 are sectional views illustrating a seventh embodiment of a method for manufacturing a capacitor of a semiconductor memory device according to the present invention. In this embodiment, the same procedure is repeated as in Embodiment 1 except that instead of forming only a first conductive layer 50, a first conductive layer 50, a native oxide layer 55 and third conductive layer are formed.

Figure 31:
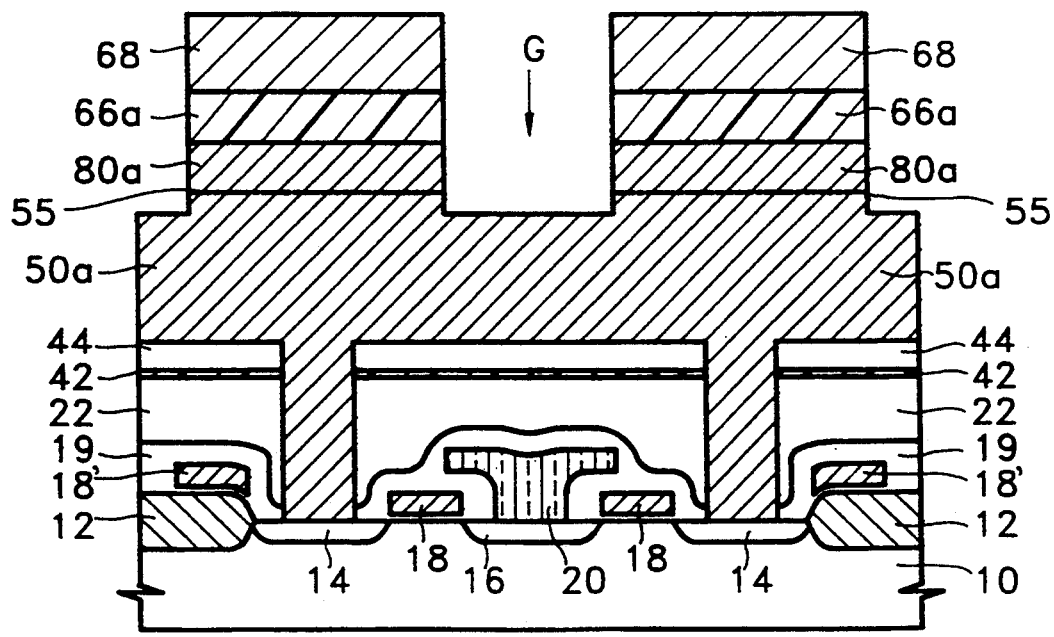
FIGS. 31 to 35 are sectional views illustrating a seventh embodiment for manufacturing a capacitor of a semiconductor memory device according to the present invention.

FIG. 31 illustrates a step of forming a first conductive layer pattern 50a, a native oxide layer 55 and a third conductive pattern 80a.

Particularly, the manufacturing procedure is repeated in the same manner as in Embodiment 1, until first conductive layer pattern 50 of FIG. 5 is formed. Thereafter, the same conductive material as that constituting the first conductive layer is deposited on the first conductive layer to a thickness of 500 Å–1,000 Å, to thereby form a third conductive layer (not shown). Since the third conductive layer is formed after exposing the first conductive layer to an atmosphere, a thin native oxide layer 55 is formed between first and second conductive layers.

Next, a material whose etch rate is different from that of the material constituting the third conductive layer with respect to an etching, (for example, a nitride such as silicon nitride or an oxide such as an HTO), is deposited on the surface of the resultant structure to a thickness of about 500 Å–1,000 Å, thereby forming a first material layer. Then, a photoresist is deposited on the surface of the first material layer to form a second material layer. Thereafter, the second and first material layers are patterned into individual cell units, thereby forming a precursory first material pattern 66a and second material pattern 68 stacked on one another. Then, a portion of the third conductive layer located beneath precursory first material pattern 66is anisotropically etched using second material pattern 68 as an etching mask, to thereby form a third conductive pattern 80a and first conductive layer pattern 50a having a groove G between adjacent cell units as seen in FIG. 31. Here, native oxide layer 55 is used as an end-of-etch detection layer in the etching process for forming third conductive pattern 80a. Native oxide layer 55 not only facilitates the termination of the dry etching, but also enables the first conductive layer 50 to be over etched to a depth of about 500 Å–1,000 Å to form first conductive layer pattern 50a having groove G between adjacent cell units. Since the native oxide layer 55 between the first and the second conductive layers can be utilized as a reference for the etching step, the reproducibility of the etching process is enhanced.

Figure 32:
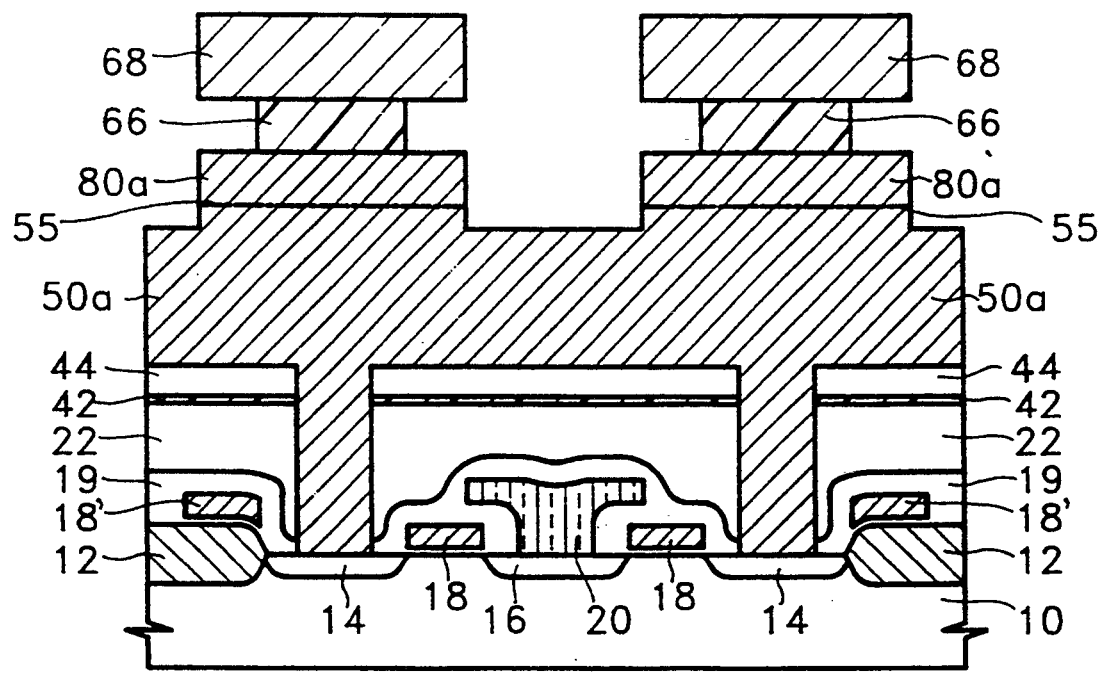

FIG. 32 illustrate a step of forming first material pattern 66. The precursory first material pattern 66a is isotropically etched inwardly from the sidewalls thereof, so as to remove peripheral edge portions of the precursory first material pattern 66a by a width of about 1,000 Å, thereby forming first material pattern 66 as in Embodiment 1.

Figure 33:
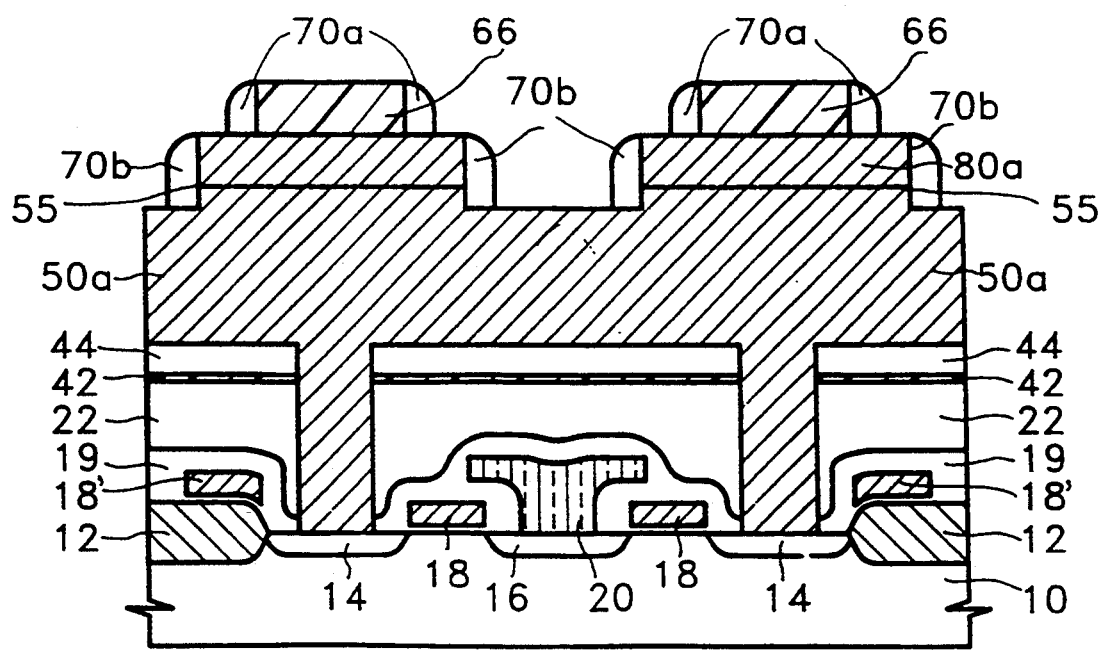

FIG. 33 illustrates a step of forming first spacers 70a on the sidewalls of first material patterns 66 and forming second spacers 70b on the sidewalls of third conductive patterns 80a and the groove of first conductive layer pattern 50a. This step is the same as described in Embodiment 1.

Figure 34:
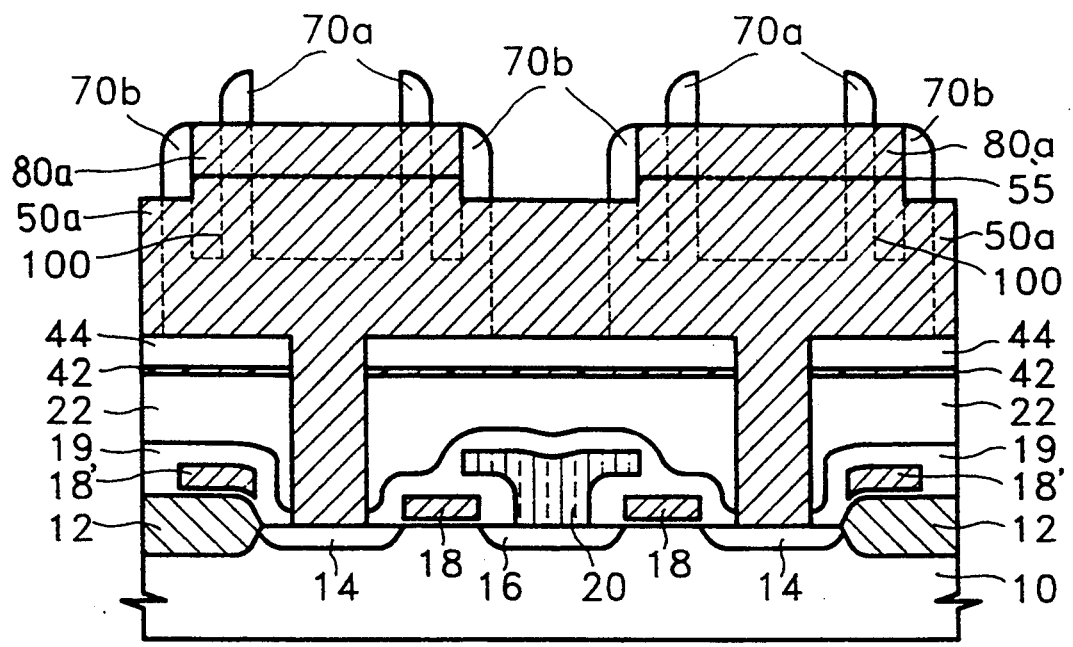

FIG. 34 illustrates a step of forming a storage electrode 100. After removing first material pattern 66, third conductive pattern 80a and first conductive layer pattern 50a are simultaneously anisotropically etched until the surface of spacer layer 44 between adjacent second spacers 70b is exposed so as to complete a double-cylindrical storage electrode 100 defined by the dotted line in FIG. 34, in the same manner as in Embodiment 1.

Figure 35:
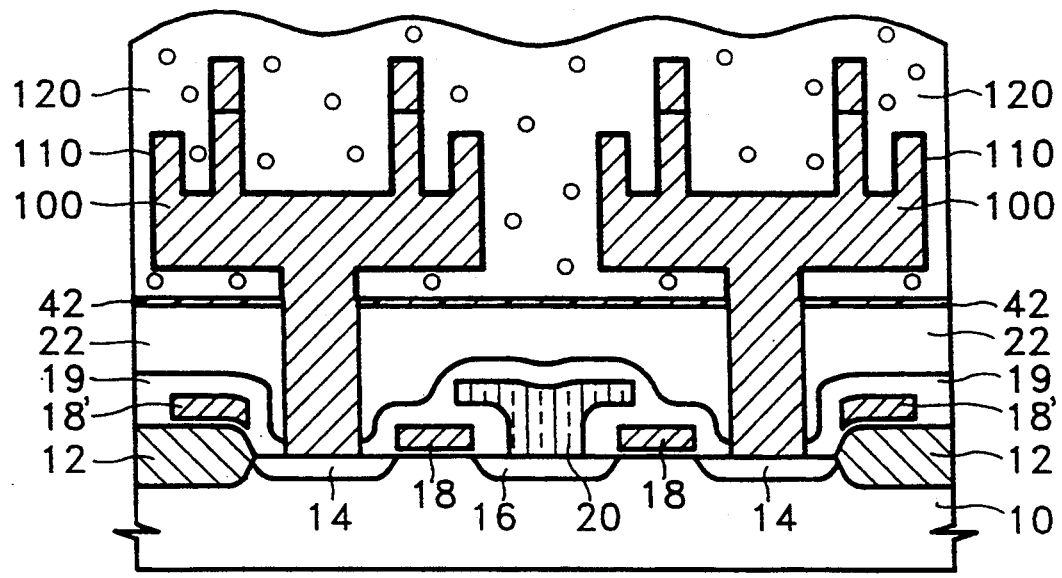

FIG. 35 illustrates a step of forming a dielectric film 110 and a plate electrode 120. After removing first and second spacers 70a and 70b and spacer layer 44, a dielectric film 110 and a plate electrode 120 is formed, thereby completing a capacitor comprising storage electrode 100, dielectric film 110 and plate electrode 120. The remaining portions of third material pattern 80a disposed on the inner cylindrical wall of first conductive layer pattern 50a are effectively incorporated therein because they are made from the same material.

According to the seventh embodiment, a native oxide layer is utilized for the end-of-etch detection of an etching process. The native oxide layer formed between two conductive layers comprised of polycrystalline silicon ensures process reproducibility.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method of manufacturing a capacitor electrode of a semiconductor device comprising the steps of:
   (a) forming at least one first conductive layer pattern in a first conductive layer defined by at least one groove formed therearound;
   (b) forming a first material pattern on each said at least one first conductive layer pattern which is smaller than said first conductive layer pattern;
   (c) forming a first spacer on a sidewall of each said first material pattern and forming a second spacer on a sidewall of said at least one first conductive layer pattern such that a portion of said at least one first conductive layer pattern is left exposed therebetween;
   (d) removing each said first material pattern; and
   (e) partially anisotropically etching each said at least one first conductive layer pattern using said first and second spacers as etching masks to obtain at least one double-walled storage electrode of said capacitor.

2. A method of manufacturing a capacitor electrode according to claim 1, wherein said at least one first conductive layer pattern having a first material pattern formed thereon is formed by a method comprising the steps of:
   (a) forming a first conductive layer on a substrate;
   (b) forming at least one composite pattern including a second material pattern stacked on a precursory first material pattern on said first conductive layer to define said at least one first conductive layer pattern;
   (c) isotropically etching a periphery of each said precursory first material pattern to obtain said first material pattern;
   (d) partially isotropically etching said first conductive layer using said second material pattern as an etch mask to obtain said at least one first conductive layer pattern defined by a groove formed therearound; and
   (e) removing said second material pattern.

3. A method of manufacturing a capacitor electrode according to claim 1, further comprising the steps of:
   (a) forming a spacer layer immediately prior to forming said first conductive layer; and
   (b) removing said spacer layer after obtaining said double-walled storage electrode.

4. A method of manufacturing a capacitor electrode according to claim 1, further comprising the steps of:
   (a) thermally oxidizing an exposed surface portion of said at least one first conductive layer pattern to obtain an oxide layer; and
   (b) removing said oxide layer.

5. A method of manufacturing a capacitor electrode according to claim 1, further comprising the steps of:
   (a) forming a native oxide layer on each said at least one first conductive layer pattern; and
   (b) forming a third conductive pattern on each said native oxide layer.

6. A method of manufacturing a capacitor electrode in a semiconductor device, comprising the steps of:
   (a) forming a first conductive layer on a semiconductor substrate;
   (b) forming at least one composite pattern having a second material pattern stacked on a precursory first material pattern on said first conductive layer to define a corresponding individual cell unit;
   (c) isotropically etching a periphery of each said precursory first material pattern, thereby forming an undercut portion underneath an edge portion of said second material pattern and thereby obtaining a first material pattern which is smaller than said corresponding second material pattern;
   (d) forming a fifth material layer on said first conductive layer having said stacked first and second material patterns formed thereon such that each said undercut portion is filled, thereby;
   (e) anisotropically etching said fifth material layer and said first conductive layer and said first conductive layer using said second material pattern as an etch mask to obtain at least one first conductive layer pattern having a groove formed therearound in said first conductive layer, such that portions of said fifth material layer in said under cut portions remain to thereby obtain a fifth material pattern;
   (f) removing said second and first material patterns;
   (g) forming a first spacer on an inner sidewall of said fifth material pattern and forming a second spacer on an outer sidewall of said fifth material pattern and a sidewall of said groove formed in said first conductive layer; and
   (h) partially anisotropically etching said fifth material pattern and said first conductive layer pattern using said first and second spacers as etch masks to obtain a double-walled capacitor electrode.

7. A method according to claim 6, wherein said fifth material layer and said first conductive layer are formed from the same material.

8. A method of manufacturing a capacitor electrode in a semiconductor device, comprising the steps of:
  (a) forming a first conductive layer on a semiconductor substrate;
  (b) forming at least one composite pattern having a second material pattern stacked on a precursory first material pattern on said first conductive layer on said first conductive layer;
  (c) isotropically etching away a peripheral portion of each said precursory first material pattern to form an undercut portion under an edge of each said second material pattern and to obtain a first material pattern smaller than a respective second material pattern;
  (d) anisotropically etching said first conductive layer using each said second material pattern as an etching mask to obtain a corresponding first conductive pattern;
  (e) removing each said second material pattern;
  (f) forming a first spacer around each said first material pattern;
  (g) removing each said first material pattern;
  (h) anisotropically etching each said first conductive pattern using said first spacer as an etch mask to form a corresponding second conductive pattern having an upwardly protruding step portion corresponding in location to said first spacer;
  (i) forming a first wall spacer on an inner sidewall of each upwardly protruding step portion and a second wall spacer on an outer sidewall of each said upwardly protruding step portion; and
  (j) anisotropically etching each said second conductive pattern using said fist and second wall spacers as etch masks to obtain a double-cylindrical storage electrode of a capacitor.

* * * * *